(12) United States Patent
Matsudai et al.

(10) Patent No.: US 11,563,113 B2
(45) Date of Patent: Jan. 24, 2023

(54) SEMICONDUCTOR DEVICE AND INTEGRATED CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tomoko Matsudai, Tokyo (JP); Yoko Iwakaji, Meguro Tokyo (JP); Hiroko Itokazu, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 8 days.

(21) Appl. No.: 17/191,288

(22) Filed: Mar. 3, 2021

(65) Prior Publication Data
US 2022/0085190 A1 Mar. 17, 2022

(30) Foreign Application Priority Data
Sep. 16, 2020 (JP) .............................. JP2020-155896

(51) Int. Cl.
*H01L 29/739* (2006.01)
*H01L 27/088* (2006.01)
*H01L 27/082* (2006.01)

(52) U.S. Cl.
CPC ........ *H01L 29/7397* (2013.01); *H01L 27/088* (2013.01); *H01L 27/0825* (2013.01)

(58) Field of Classification Search
CPC ............. H01L 29/7397; H01L 27/0825; H01L 27/088; H01L 29/42368; H01L 29/512; H01L 29/7395; H01L 29/747; H01L 21/823456; H01L 21/823462; H01L 27/0694
See application file for complete search history.

(56) References Cited

U.S. PATENT DOCUMENTS

| 4,980,743 A | 12/1990 | Nakagawa et al. |
| 8,018,031 B2 | 9/2011 | Yanagida |

(Continued)

FOREIGN PATENT DOCUMENTS

| JP | S64-57674 A | 3/1989 |
| JP | 2009-141270 A | 6/2009 |

(Continued)

*Primary Examiner* — Cuong B Nguyen
(74) *Attorney, Agent, or Firm* — Kim & Stewart LLP

(57) ABSTRACT

A semiconductor device includes a semiconductor layer having first and second surfaces, a first electrode and a first gate electrode along the first surface, and a second electrode and a second gate electrode along the second surface. The layer includes a first type first region, a second type second region between the first region and the first surface and facing the first gate electrode, a first type third region between the second region and the first surface and contacting the first electrode, a second type fourth region between the first region and the second surface, facing the second gate electrode, and contacting the second electrode, and a first type fifth region between the fourth region and the second surface and contacting the second electrode. Transistors including the first and second gate electrodes have different threshold voltages that are both positive or negative.

19 Claims, 16 Drawing Sheets

(56) References Cited

U.S. PATENT DOCUMENTS

| | | |
|---|---|---|
| 8,421,184 B2 | 4/2013 | Koyama et al. |
| 9,324,848 B2 | 4/2016 | Sumitomo et al. |
| 9,515,067 B2 | 12/2016 | Saikaku et al. |
| 2014/0209972 A1 | 7/2014 | Sumitomo et al. |
| 2017/0250260 A1 | 8/2017 | Bina et al. |
| 2019/0296133 A1 | 9/2019 | Iwakaji et al. |
| 2020/0091323 A1 | 3/2020 | Iwakaji et al. |
| 2020/0091325 A1 | 3/2020 | Matsudai et al. |
| 2020/0091326 A1 | 3/2020 | Iwakaji et al. |
| 2020/0098903 A1 | 3/2020 | Satoh |
| 2020/0303524 A1 | 9/2020 | Matsudai et al. |
| 2020/0303527 A1 | 9/2020 | Matsudai et al. |

FOREIGN PATENT DOCUMENTS

| | | |
|---|---|---|
| JP | 2010-251517 A | 11/2010 |
| JP | 5417811 B2 | 2/2014 |
| JP | 2020-053466 A | 4/2020 |

SEMICONDUCTOR DEVICE AND INTEGRATED CIRCUIT

CROSS-REFERENCE TO RELATED APPLICATION

This application is based upon and claims the benefit of priority from Japanese Patent Application No. 2020-155896, filed on Sep. 16, 2020, the entire contents of which are incorporated herein by reference.

FIELD

Embodiments described herein relate generally to a semiconductor device and an integrated circuit.

BACKGROUND

As an example of a power semiconductor device, there is an insulated gate bipolar transistor (IGBT). In an IGBT, a p-type collector area, an n-type drift area, and a p-type base area are provided on a collector electrode. Then, a gate electrode is provided on the p-type base area with a gate insulating film interposed therebetween. Furthermore, an n-type emitter area that is connected to an emitter electrode is provided on a surface of the p-type base area.

In the IGBT described above, a channel is formed in the p-type base area when a positive voltage higher than a threshold voltage is applied to the gate electrode. Then, electrons are injected from the n-type emitter area into the n-type drift area, and holes are injected from the p-type collector area into the n-type drift area. With this configuration, a current with electrons and holes as carriers flows between the collector electrode and the emitter electrode.

In order to improve the characteristics of the IGBT, various attempts at reducing the on-state resistance ("on resistance"), reducing turn-off loss, and preventing generation of a surge voltage have been made. For example, in order to reduce the turn-off loss of an IGBT, the gate electrode can also be provided on the collector electrode side. At the time of turning off the IGBT, a voltage higher than the threshold voltage is applied to the gate electrode to prevent injection of holes from the collector electrode, and the turn-off time is shortened to reduce the turn-off loss.

DETAILED DESCRIPTION

Figure 1:
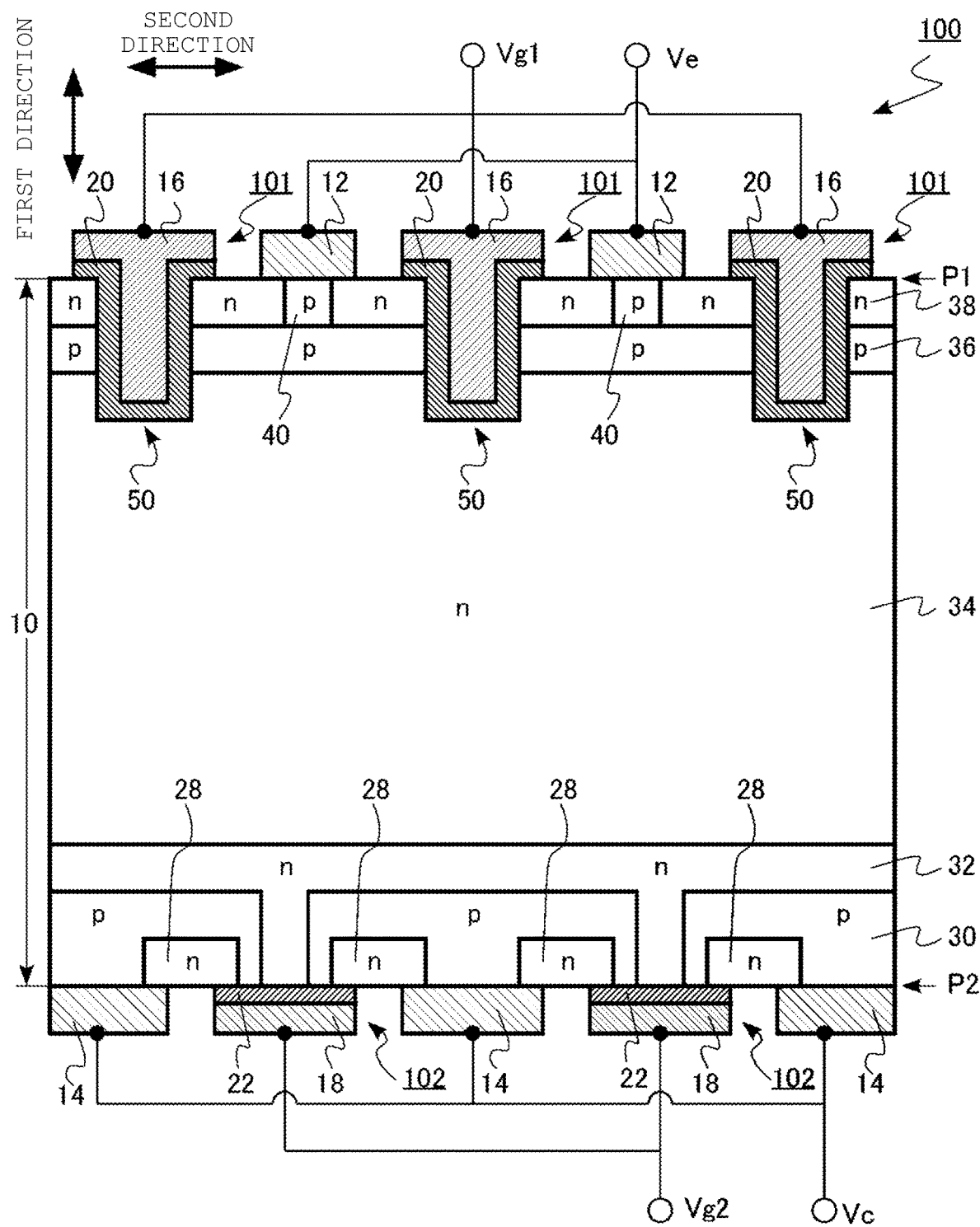
FIG. 1 is a schematic cross-sectional view of a semiconductor device according to a first embodiment.

Embodiments provide a semiconductor device with reduced turn-off loss.

In general, according to one embodiment, a semiconductor device includes a semiconductor layer having first and second surfaces, a first electrode and a first gate electrode arranged along the first surface, and a second electrode and a second gate electrode arranged along the second surface. The semiconductor layer further includes a first semiconductor region of a first conductivity type, a second semiconductor region of a second conductivity type provided between the first semiconductor region and the first surface and facing the first gate electrode, a third semiconductor region of the first conductivity type provided between the second semiconductor region and the first surface and contacting the first electrode, a fourth semiconductor region of the second conductivity type provided between the first semiconductor region and the second surface, facing the second gate electrode, and contacting the second electrode, and a fifth semiconductor region of the first conductivity type provided between the fourth semiconductor region and the second surface and contacting the second electrode. A first transistor including the first gate electrode and a second transistor including the second gate electrode have first and second threshold voltages that are different and both positive or negative.

Hereinafter, embodiments of the present disclosure will be described with reference to the drawings. In the following description, the same and similar members and the like are designated by the same reference numerals, and the description of the members and the like once described may be omitted as appropriate.

In the present specification, a "carrier concentration" of a semiconductor region means a difference between the majority carrier concentration and the minority carrier concentration of a thermal equilibrium state. A relative magnitude relationship between the "carrier concentrations" of two semiconductor regions can be determined using, for example, a scanning capacitance microscopy (SCM). The distribution and absolute value of the "carrier concentration" can be measured by using, for example, spreading resistance analysis (SRA). The distribution and absolute value of an "impurity concentration" of the semiconductor region can be measured by using, for example, a secondary ion mass spectrometry (SIMS).

First Embodiment

Figure 2:
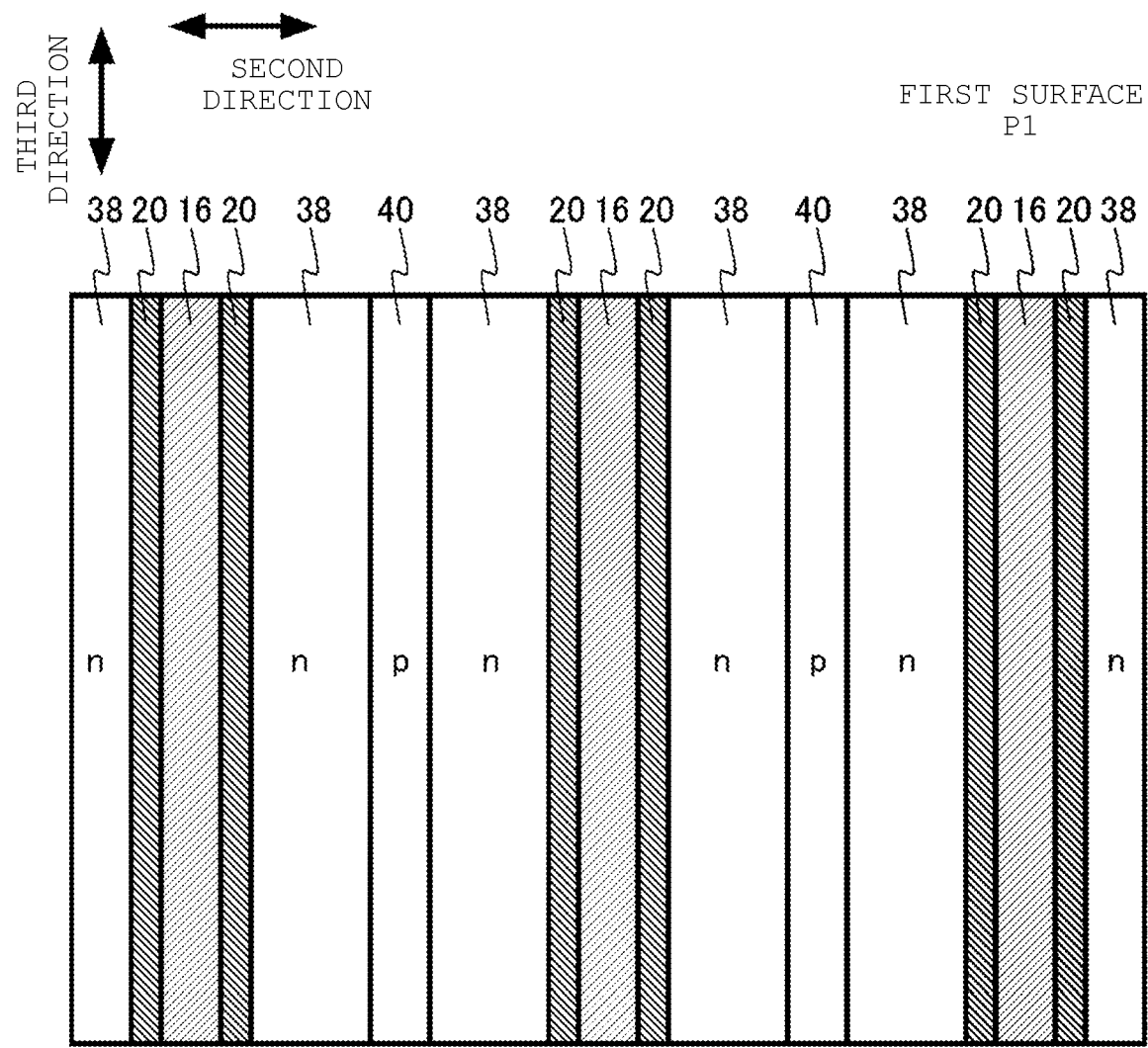
FIG. 2 is a schematic plan view of a first surface of a semiconductor device according to a first embodiment.
Figure 3:
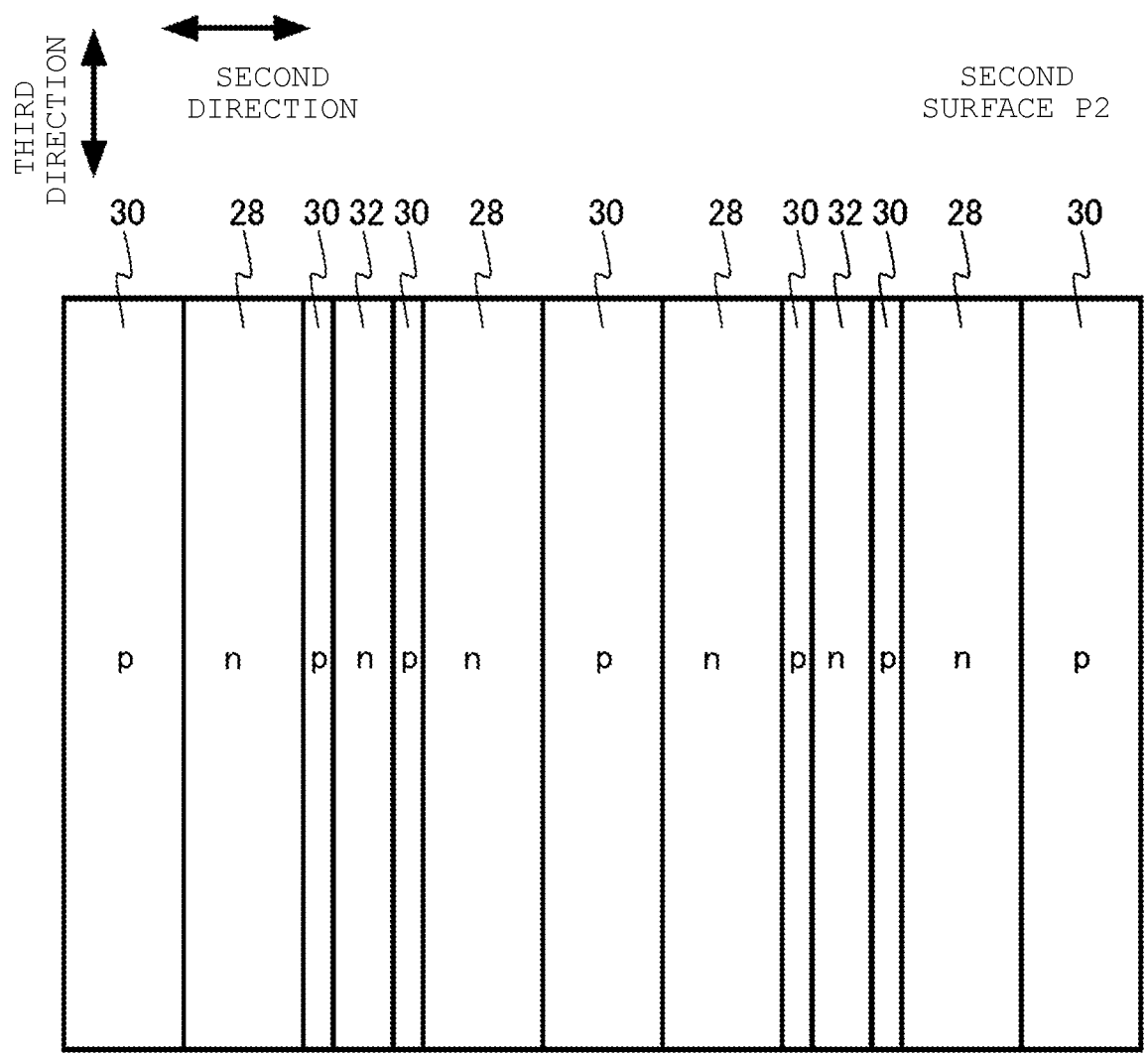
FIG. 3 is a schematic plan view of a second surface of a semiconductor device according to a first embodiment.

FIG. 1 is a schematic cross-sectional view of a part of a semiconductor device according to a first embodiment. FIG. 2 is a schematic plan view of a first surface of the semiconductor device. FIG. 3 is a schematic plan view of a second surface of the semiconductor device. Hereinafter, a case where a first conductivity type is an n-type and a second conductivity type is a p-type will be described as an example.

For example, the semiconductor device is an IGBT 100. The IGBT 100 includes a semiconductor layer 10, an emitter electrode 12, a collector electrode 14, a main gate electrode 16, a control gate electrode 18, a first gate insulating film 20, and a second gate insulating film 22. A trench 50 is formed in the semiconductor layer 10.

The IGBT 100 includes a main transistor 101 including the main gate electrode 16 as a gate electrode and a control transistor 102 including the control gate electrode 18 as a gate electrode.

The main transistor 101 is provided on a front or upper surface of the semiconductor layer 10. The control transistor 102 is provided on a rear or lower surface of the semiconductor layer 10.

In the semiconductor layer 10, an n-type rear surface drain area 28, a p-type collector area 30, an n-type buffer area 32, an n-type drift area 34, a p-type base area 36, an n-type emitter area 38, and a p-type contact area 40 are provided.

The semiconductor layer 10 has the front surface P1, which is hereinafter referred to as the first surface P1, and the rear surface P2, which is hereinafter referred to as the second surface P2, facing the first surface P1. The semiconductor layer 10 is, for example, monocrystalline silicon. A film thickness of the semiconductor layer 10 is, for example, 40 μm or more and 700 μm or less.

A normal line direction of the first surface P1 and the normal line direction of the second surface P2 are defined as a first direction. One direction parallel to the first surface P1 and the second surface P2 is defined as a second direction. A direction parallel to the first surface P1 and the second surface P2 and perpendicular to the second direction is defined as a third direction.

The emitter electrode 12 is provided on the first surface P1 of the semiconductor layer 10. At least a part of the emitter electrode 12 is in contact with the first surface P1 of the semiconductor layer 10. The emitter electrode 12 is, for example, a metal. An emitter voltage Ve is applied to the emitter electrode 12. The emitter voltage is, for example, 0 V.

The collector electrode 14 is provided on the second surface P2 of the semiconductor layer 10. At least a part of the collector electrode 14 is in contact with the second surface P2 of the semiconductor layer 10. The collector electrode 14 is, for example, a metal.

A collector voltage Vc is applied to the collector electrode 14. The collector voltage is, for example, 200 V or more and 6500 V or less.

The main gate electrode 16 is provided along the first surface P1 of the semiconductor layer 10. At least a part of the main gate electrode 16 is provided in the trench 50 formed on the side of the first surface P1 of the semiconductor layer 10. The main gate electrode 16 extends in the third direction along the first surface P1 of the semiconductor layer 10.

The main gate electrode 16 is, for example, polycrystalline silicon containing n-type impurities or p-type impurities. A first gate voltage Vg1 is applied to the main gate electrode 16. The first gate voltage Vg1 is a voltage with the emitter voltage Ve as a reference.

The first gate insulating film 20 is provided between the main gate electrode 16 and the semiconductor layer 10. At least a part of the first gate insulating film 20 is provided in the trench 50. The first gate insulating film 20 is, for example, a silicon oxide film.

The control gate electrode 18 is provided along the second surface P2 of the semiconductor layer 10. The control gate electrode 18 extends in the third direction along the second surface P2 of the semiconductor layer 10.

The control gate electrode 18 is, for example, polycrystalline silicon containing n-type impurities or p-type impurities. A second gate voltage Vg2 is applied to the control gate electrode 18. The second gate voltage Vg2 is a voltage with the collector voltage Vc as a reference.

The second gate insulating film 22 is provided between the control gate electrode 18 and the semiconductor layer 10. The second gate insulating film 22 is, for example, a silicon oxide film.

The p-type collector area 30 is provided between the drift area 34 and the second surface P2. A part of the collector area 30 is in contact with the second surface P2.

A part of the collector area 30 faces the control gate electrode 18 with the second gate insulating film 22 interposed therebetween. The collector area 30 extends in the third direction along the second surface P2. A channel of the control transistor 102 controlled by the control gate electrode 18 is formed in the collector area 30 facing the control gate electrode 18.

The collector area 30 is electrically connected to the collector electrode 14. A part of the collector area 30 is in contact with the collector electrode 14.

The n-type rear surface drain area 28 is provided between the collector area 30 and the second surface P2. A part of the rear surface drain area 28 faces the control gate electrode 18 with the second gate insulating film 22 interposed therebetween. The collector area 30 is provided between the rear surface drain area 28 and the buffer area 32.

A part of the n-type rear surface drain area 28 is in contact with the collector electrode 14. The rear surface drain area 28 extends in the third direction along the second surface P2. The rear surface drain area 28 functions as a drain of the control transistor 102.

An n-type impurity concentration of the rear surface drain area 28 is higher than the n-type impurity concentration of the drift area 34.

The n-type drift area 34 is provided between the collector area 30 and the first surface P1. The drift area 34 is provided between the collector area 30 and the base area 36.

The drift area 34 serves as an on-current path when the IGBT 100 is in an on state. The drift area 34 has a function of depleting when the IGBT 100 is in an off state and maintaining a breakdown voltage of the IGBT 100.

The n-type buffer area 32 is provided between the drift area 34 and the collector area 30. A part of the buffer area 32 is in contact with the second surface P2. A part of the buffer area 32 faces the control gate electrode with the second gate insulating film 22 interposed therebetween.

The n-type impurity concentration of the buffer area 32 is higher than the n-type impurity concentration of the drift area 34.

The buffer area 32 has a lower resistance than the drift area 34. By providing the buffer area 32, when the control transistor 102 is turned on, discharge of electrons from the drift area 34 to the collector electrode 14 via the control transistor 102 is promoted. The buffer area 32 also has a function of preventing elongation of the depletion layer when the IGBT 100 is in the off state. A configuration not including the buffer area 32 may also be adopted.

The p-type base area 36 is provided between the drift area 34 and the first surface P1. A part of the base area faces the main gate electrode 16 with the first gate insulating film 20 interposed therebetween. In the base area 36 facing the main gate electrode 16, a channel of the main transistor 101 controlled by the main gate electrode 16 is formed.

The n-type emitter area 38 is provided between the base area 36 and the first surface P1. A part of the emitter area 38 faces the main gate electrode 16 with the first gate insulating film 20 interposed therebetween. The emitter area 38 extends in the third direction along the first surface P1.

The emitter area 38 is electrically connected to the emitter electrode 12. A part of the emitter area 38 is in contact with the emitter electrode 12.

The n-type impurity concentration of the emitter area 38 is higher than the n-type impurity concentration of the drift area 34. The emitter area 38 serves as an electron supply source when the IGBT 100 is in the on state.

The p-type contact area 40 is provided between the base area 36 and the first surface P1. The contact area 40 extends in the third direction along the first surface P1.

The contact area 40 is electrically connected to the emitter electrode 12. The contact area 40 is in contact with the emitter electrode 12.

The p-type impurity concentration of the contact area 40 is higher than the p-type impurity concentration of the base area 36.

The main transistor 101 is a trench gate type transistor including a main gate electrode in the trench. The main transistor 101 is a normally-off n-channel type transistor. The main transistor 101 controls the conduction of carriers between the emitter area 38 and the drift area 34 by forming a channel in the base area 36. The main transistor 101 has a first threshold voltage Vth1. The first threshold voltage Vth1 is a positive voltage.

The control transistor 102 is a planar gate type transistor. The control transistor 102 is the normally-off n-channel type transistor. The control transistor 102 controls the conduction of carriers between the buffer area 32 or the drift area 34 and the rear surface drain area 28 by forming a channel in the collector area 30. The control transistor 102 has a second threshold voltage Vth2.

The positive and negative signs of the second threshold voltage Vth2 of the control transistor 102 and the first threshold voltage Vth1 of the main transistor 101 are the same. An absolute value of the second threshold voltage Vth2 of the control transistor 102 is smaller than an absolute value of the first threshold voltage Vth1 of the main transistor 101. The absolute value of the second threshold voltage Vth2 is, for example, 0.2 times or more and less than 1 times the absolute value of the first threshold voltage Vth1.

In the IGBT 100, both the first threshold voltage Vth1 and the second threshold voltage Vth2 have positive signs. That is, both the first threshold voltage Vth1 and the second threshold voltage Vth2 are positive voltages. Accordingly, the second threshold voltage Vth2 is lower than the first threshold voltage Vth1.

For example, the second threshold voltage Vth2 can be made lower than the first threshold voltage Vth1 by making the p-type impurity concentration of the collector area 30 facing the control gate electrode 18 lower than the p-type impurity concentration of the base area 36 facing the main gate electrode 16. Further, for example, the second threshold voltage Vth2 can be made lower than the first threshold voltage Vth1 by making a film thickness of the second gate insulating film 22 thinner than the film thickness of the first gate insulating film 20.

When comparing the magnitude of the first threshold voltage Vth1 and the second threshold voltage Vth2, a bias condition for determining the threshold voltage is the same for the main transistor 101 and the control transistor 102.

Figure 4:
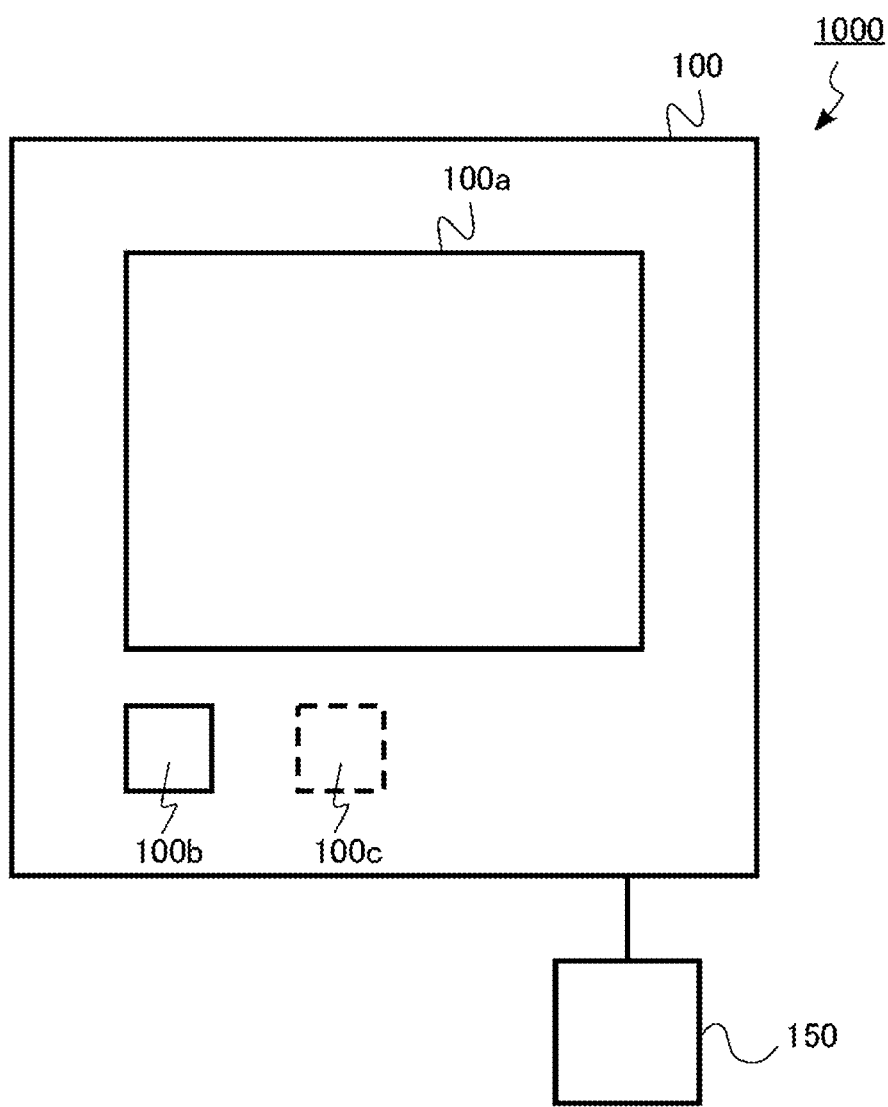
FIG. 4 is a schematic diagram of a semiconductor circuit according to a first embodiment.

FIG. 4 is a schematic diagram of a semiconductor circuit 1000 including the IGBT 100 and a control circuit 150. The semiconductor circuit 1000 is, for example, a semiconductor module in which the IGBT 100 and the control circuit 150 are mounted.

The IGBT 100 includes a transistor area 100*a*, a front surface gate electrode pad 100*b*, and a rear surface gate electrode pad 100*c*. The rear surface gate electrode pad 100*c* is positioned on an opposite surface of the semiconductor chip to the front surface gate electrode pad 100*b*.

The surface gate electrode pad 100*b* is electrically connected to the main gate electrode 16. The rear surface gate electrode pad 100*c* is electrically connected to the control gate electrode 18.

The first gate voltage Vg1 is applied to the surface gate electrode pad 100*b*. The second gate voltage Vg2 is applied to the rear surface gate electrode pad 100*c*.

The control circuit 150 controls the IGBT 100. The control circuit 150 is, for example, a gate driver circuit. The gate driver circuit controls the voltage applied to the front surface gate electrode pad 100*b* and the rear surface gate electrode pad 100*c*. The gate driver circuit controls the first gate voltage Vg1 applied to the main gate electrode 16 and the second gate voltage Vg2 applied to the control gate electrode 18.

The gate driver circuit applies a first turn-on voltage Von1 to the main gate electrode 16, and applies a second turn-on voltage Von2 different from the first turn-on voltage Von1 to the control gate electrode 18. The absolute value of the second turn-on voltage Von2 is smaller than the absolute value of the first turn-on voltage Von1.

The first turn-on voltage Von1 and the second turn-on voltage Von2 are positive voltages. Accordingly, the second turn-on voltage Von2 is lower than the first turn-on voltage Von1.

Next, an operation of the IGBT 100 will be described.

Figure 5:
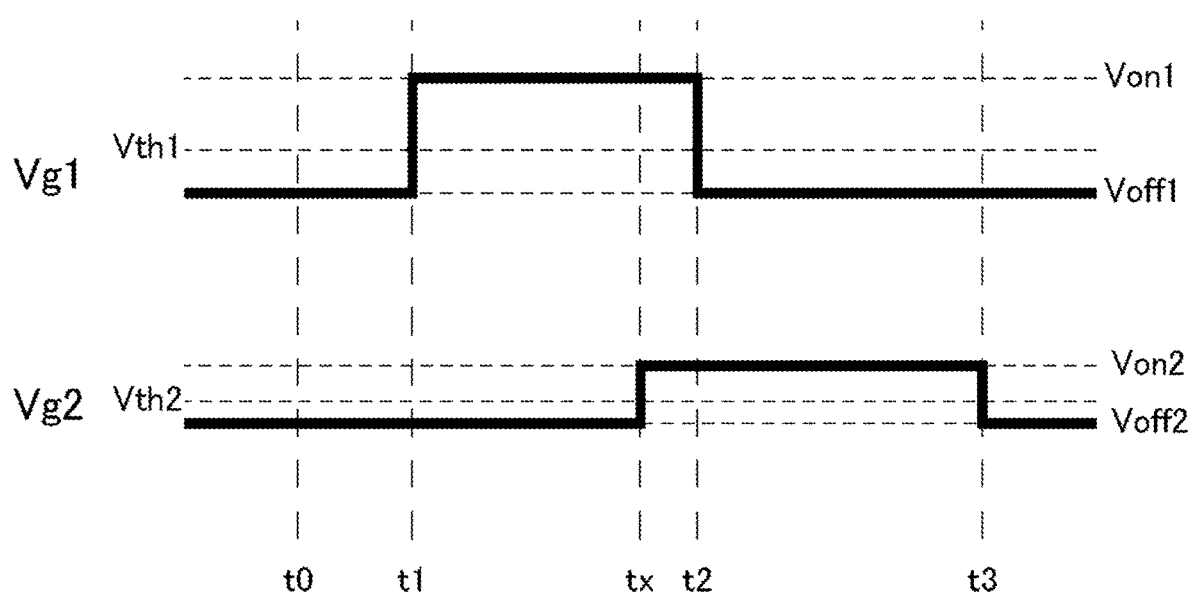
FIG. 5 is a timing chart of a semiconductor device according to a first embodiment.

FIG. 5 is a timing chart of the first gate voltage Vg1 and the second gate voltage Vg2.

While the IGBT 100 is turned off, the emitter voltage Ve is applied to the emitter electrode 12. For example, at time t0, the emitter voltage Ve is applied to the emitter electrode 12. The emitter voltage Ve is, for example, 0 V. The collector voltage Vc is applied to the collector electrode 14. The collector voltage Vc is, for example, 200 V or more and 6500 V or less. A collector-emitter voltage Vce applied between the collector electrode 14 and the emitter electrode 12 is, for example, 200 V or more and 6500 V or less.

The first gate voltage Vg1 is a voltage with the emitter voltage Ve as a reference. The second gate voltage Vg2 is a voltage with the collector voltage Vc as a reference.

When the IGBT 100 is in an off state, a first turn-off voltage Voff1 is applied as the first gate voltage Vg1. The first turn-off voltage Voff1 is a voltage equal to or lower than the first threshold voltage Vth1 at which the main transistor 101 is not turned on. The first turn-off voltage Voff1 is, for example, 0 V or a negative voltage.

While the IGBT 100 is turned off, a second turn-off voltage Voff2 is applied as the second gate voltage Vg2. The second turn-off voltage Voff2 is a voltage equal to or lower than the second threshold voltage Vth2 at which the control transistor 102 is not turned on. The second turn-off voltage Voff2 is, for example, 0 V or a negative voltage.

The IGBT 100 is turned on at time t1. When the IGBT 100 is turned on to be brought into the on state, the first turn-on voltage Von1 is applied to the main gate electrode 16 as the first gate voltage Vg1. The first turn-on voltage Von1 is a positive voltage exceeding the first threshold voltage Vth1 of the main transistor 101 including the main gate electrode 16 as the gate electrode. The first turn-on voltage Von1 is, for example, 15 V.

By applying the first turn-on voltage Von1 to the main gate electrode 16, an n-type inversion layer is formed in the vicinity of an interface of the p-type base area 36 with the first gate insulating film 20. By forming the n-type inversion layer, electrons are injected from the n-type emitter area 38 into the n-type drift area 34 through the n-type inversion layer. The pn junction formed by the n-type buffer area 32 and the p-type collector area 30 is forward biased by the electrons injected into the n-type drift area 34. The electrons reach the collector electrode 14 and cause injection of holes from the p-type collector area 30. The IGBT 100 is turned on.

When the IGBT 100 is in the on state, the second gate voltage Vg2 is the second turn-off voltage Voff2.

The IGBT 100 is turned off at time t2. When the IGBT 100 is turned off to be brought into the off state, the first turn-off voltage Voff1 is applied to the main gate electrode 16 as the first gate voltage Vg1.

By applying the first turn-off voltage Voff1 to the main gate electrode 16, the n-type inversion layer formed in the vicinity of the interface of the p-type base area 36 with the first gate insulating film 20 is removed. Therefore, the injection of electrons from the n-type emitter area 38 to the n-type drift area 34 is stopped. The IGBT 100 shifts to the off state.

At time tx before the first turn-off voltage Voff1 is applied to the main gate electrode 16, the second turn-on voltage Von2 is applied to the control gate electrode 18 as the second gate voltage Vg2. The second turn-on voltage Von2 is a positive voltage exceeding the second threshold voltage Vth2 of the control transistor 102 including the control gate electrode 18 as the gate electrode.

The absolute value of the second turn-on voltage Von2 is smaller than the absolute value of the first turn-on voltage Von1. The absolute value of the second turn-on voltage Von2 is, for example, 0.2 times or more and less than 1 times the absolute value of the first turn-on voltage Von1. The second turn-on voltage Von2 is, for example, 5 V.

The second turn-on voltage Von2 is applied to the control gate electrode 18 to bring the control transistor 102 into the on state. An n-type inversion layer is formed in the vicinity of the interface of the p-type collector area 30 with the second gate insulating film 22, and the control transistor 102 is turned on.

By forming the n-type inversion layer in the vicinity of the interface of the p-type collector area 30 with the second gate insulating film 22, a path in which electrons are discharged from the n-type buffer area 32 through the n-type inversion layer and the n-type rear surface drain area 28 to the collector electrode 14 is formed. That is, a state in which the n-type buffer area 32 and the collector electrode 14 are short-circuited, that is, a so-called anode short circuit occurs.

Due to the occurrence of the anode short circuit, electrons are prevented from reaching the collector electrode 14 from the n-type buffer area 32 through the p-type collector area 30. Therefore, the injection of holes from the p-type collector area 30 into the drift area 34 is prevented.

By preventing the injection of holes during the turn-off operation of the IGBT 100, a tail current during the turn-off operation can be reduced. Accordingly, the turn-off time of the IGBT 100 is shortened. Thus, a turn-off loss of the IGBT 100 is reduced.

After that, at time t3, the second turn-off voltage Voff2 is applied to the control gate electrode 18 to bring the control transistor 102 into the on state.

Next, the operation and effect of the semiconductor device will be described.

In the IGBT 100, the control transistor 102 is provided on the rear surface of the semiconductor layer 10. With this configuration, the injection of holes into the n-type drift area 34 is prevented during the turn-off operation. By preventing the injection of holes, the turn-off loss is reduced. Therefore, the power consumption of the IGBT 100 can be reduced.

Additionally, the second threshold voltage Vth2 of the control transistor 102 is lower than the first threshold voltage Vth1 of the main transistor 101. Accordingly, the second turn-on voltage Von2 can be made lower than the first turn-on voltage Von1. Therefore, as compared with the case where the second turn-on voltage Von2 and the first turn-on voltage Von1 are equal, the power consumption of the IGBT 100 can be reduced.

By setting the second threshold voltage Vth2 to be lower than the first threshold voltage Vth1, the manufacture of the IGBT 100 becomes easy. For example, the film thickness of the second gate insulating film 22 of the control transistor 102 can be reduced. Accordingly, the formation of the second gate insulating film 22 becomes easy. The heat treatment time when the second gate insulating film is formed by thermal oxidation can be shortened. By shortening the heat treatment time, for example, diffusion of conductive impurities ("dopants") in the semiconductor region formed in the semiconductor layer 10 is prevented. Accordingly, even if a rear surface pattern is created after a front surface pattern is created, an impurity profile in the semiconductor region is stable.

Figure 6A:
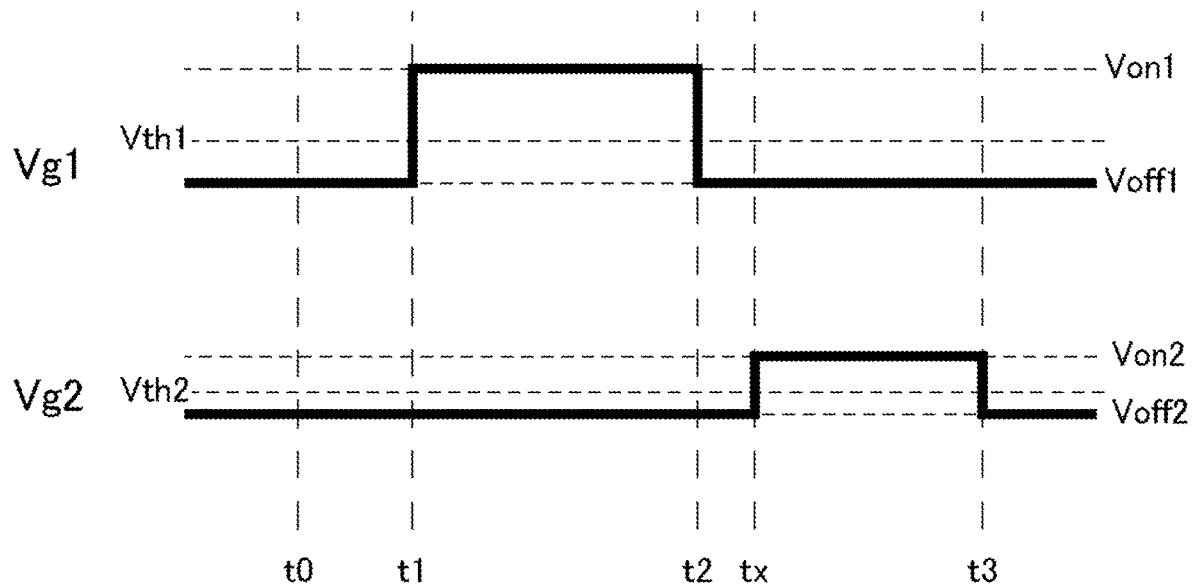
FIGS. 6A and 6B are timing charts of a semiconductor device according to a first embodiment.
Figure 6B:
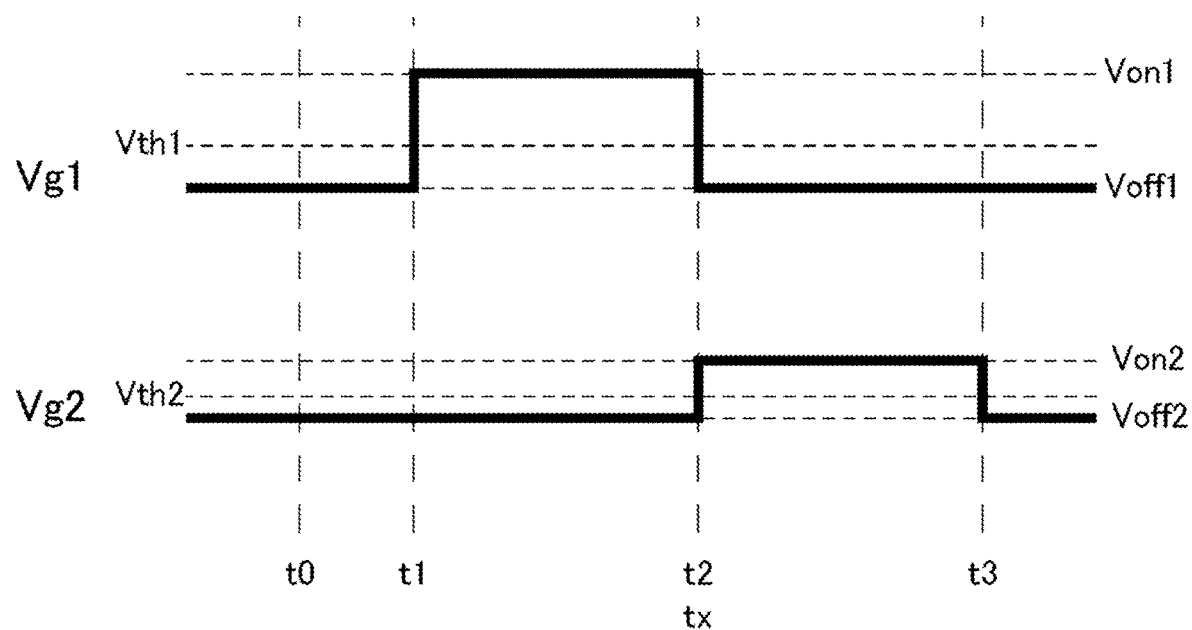

FIGS. 6A and 6B are other examples of the timing charts of the first gate voltage Vg1 and the second gate voltage Vg2.

The first example illustrated in FIG. 6A is different from the example illustrated in FIG. 5 in that the second turn-on voltage Von2 is applied to the control gate electrode 18 after the first turn-off voltage Voff1 is applied to the main gate electrode 16. That is, different from the example illustrated in FIG. 5, time tx when the second turn-on voltage Von2 is applied is after the time t2 when the first turn-off voltage Voff1 is applied to the main gate electrode 16.

The second example illustrated in FIG. 6B is different from the example illustrated in FIG. 5 in that the first turn-off voltage Voff1 is applied to the main gate electrode 16 and the second turn-on voltage Von2 is applied to the control gate electrode 18 at the same time. That is, different from the example illustrated in FIG. 5, the time tx when the second turn-on voltage Von2 is applied is the same as the time t2 when the first turn-off voltage Voff1 is applied to the main gate electrode 16.

By adjusting the time when the second turn-on voltage Von2 is applied to the control gate electrode 18, the turn-off loss can be reduced under optimum conditions in consideration of various characteristics of the IGBT 100.

The absolute value of the second threshold voltage Vth2 is preferably 0.2 times or more and less than 1 times the absolute value of the first threshold voltage Vth1, and more preferably 0.3 times or more and 0.6 times or less the absolute value of the first threshold voltage Vth1. When the absolute value of the second threshold voltage Vth2 exceeds the lower limit value described above, malfunction of the control transistor 102 due to operating noise or the like of the main transistor is prevented. When the absolute value of the second threshold voltage Vth2 is below the upper limit value described above, the power consumption is further reduced. When the absolute value of the second threshold voltage Vth2 is below the upper limit value described above, the manufacture of the IGBT 100 becomes easier.

The absolute value of the second turn-on voltage Von2 is preferably 0.2 times or more and less than 1 times the absolute value of the first turn-on voltage Von1, and more preferably 0.3 times or more and 0.6 times or less the absolute value of the first turn-on voltage Von1. When the absolute value of the second turn-on voltage Von2 exceeds the lower limit value described above, malfunction of the control transistor 102 is prevented. When the absolute value of the second turn-on voltage Von2 is below the upper limit value described above, the power consumption is further reduced. When the absolute value of the second turn-on voltage Von2 is below the upper limit value described above, the manufacture of the IGBT 100 becomes easier.

According to the semiconductor device and the semiconductor circuit described above, the turn-off loss of the IGBT can be reduced. Accordingly, the power consumption of the IGBT can be reduced.

Second Embodiment

In a semiconductor device and a semiconductor circuit according to a second embodiment, the absolute value of the second threshold voltage is larger than the absolute value of the first threshold voltage.

For example, the semiconductor device is an IGBT 200. The structure of the IGBT 200 is the same as that of the IGBT 100 illustrated in FIGS. 1 to 3. The structure of the semiconductor circuit according to the second embodiment is the same as the structure of the semiconductor circuit illustrated in FIG. 4. Hereinafter, description will be made with reference to FIGS. 1 to 4.

The main transistor 101 is a trench gate type transistor including a main gate electrode in the trench. The main transistor 101 is a normally-off n-channel transistor. The main transistor 101 has the first threshold voltage Vth1. The first threshold voltage Vth1 is a positive voltage.

The control transistor 102 is a planar gate type transistor. The control transistor 102 is the normally-off n-channel transistor. The control transistor 102 has the second threshold voltage Vth2.

The absolute value of the second threshold voltage Vth2 of the control transistor 102 is larger than the absolute value of the first threshold voltage Vth1 of the main transistor 101. The absolute value of the second threshold voltage Vth2 is, for example, greater than 1 times and 5 times or less the absolute value of the first threshold voltage Vth1.

In the IGBT 200, both the first threshold voltage Vth1 and the second threshold voltage Vth2 are positive voltages. Accordingly, the second threshold voltage Vth2 is higher than the first threshold voltage Vth1.

For example, the second threshold voltage Vth2 can be made higher than the first threshold voltage Vth1 by making the p-type impurity concentration of the collector area 30 facing the control gate electrode 18 higher than the p-type impurity concentration of the base area 36 facing the main gate electrode 16. For example, the second threshold voltage Vth2 can be made higher than the first threshold voltage Vth1 by making the film thickness of the second gate insulating film 22 thicker than the film thickness of the first gate insulating film 20.

The control circuit 150 controls the IGBT 200. The control circuit 150 is a gate driver circuit. The gate driver circuit controls the voltage applied to the front surface gate electrode pad 100b and the rear surface gate electrode pad 100c. The gate driver circuit controls the first gate voltage Vg1 applied to the main gate electrode 16 and the second gate voltage Vg2 applied to the control gate electrode 18.

The gate driver circuit applies the first turn-on voltage Von1 to the main gate electrode 16 and the second turn-on voltage Von2 different from the first turn-on voltage Von1 to the control gate electrode 18. The absolute value of the second turn-on voltage Von2 is larger than the absolute value of the first turn-on voltage Von1.

Figure 7:
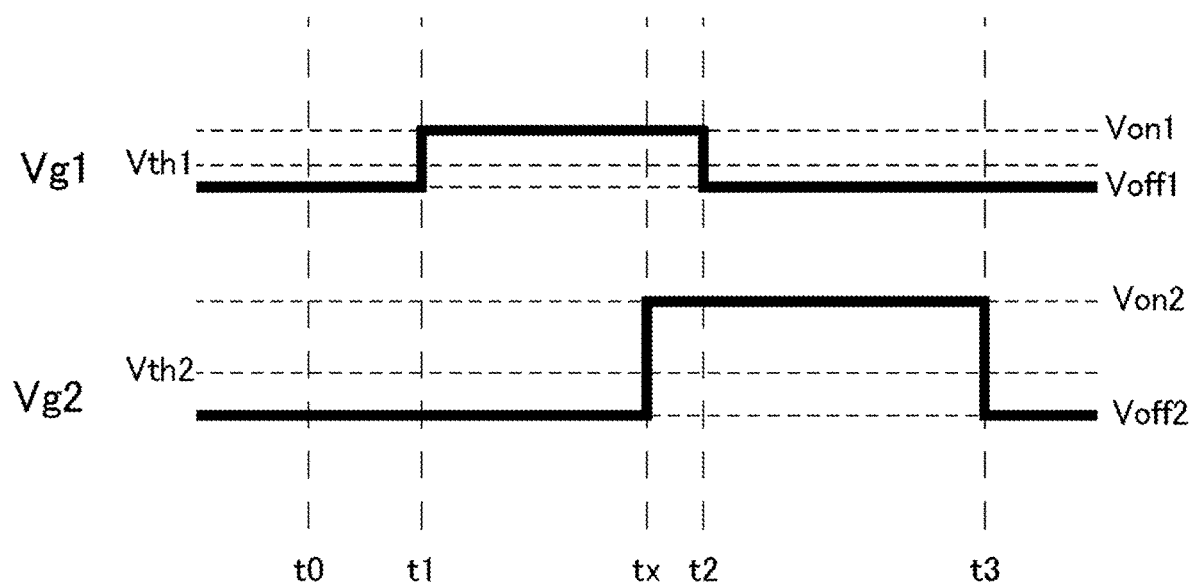
FIG. 7 is a timing chart of a semiconductor device according to a second embodiment.

FIG. 7 is a timing chart of the first gate voltage Vg1 and the second gate voltage Vg2.

In the IGBT 200, the second threshold voltage Vth2 is higher than the first threshold voltage Vth1. The absolute value of the second turn-on voltage Von2 is larger than the absolute value of the first turn-on voltage Von1. The absolute value of the second turn-on voltage Von2 is, for example, greater than 1 times and 5 times or more the absolute value of the first turn-on voltage Von1.

The first turn-on voltage Von1 is, for example, 5 V. The second turn-on voltage Von2 is, for example, 15 V.

The timing of the turn-on operation and the turn-off operation of the IGBT 200 is the same as that illustrated in FIG. 5.

Similar to the IGBT 100, the IGBT 200 includes the control transistor 102 on the rear surface of the semiconductor layer 10. With this configuration, injection of holes into the n-type drift area 34 is prevented during the turn-off operation. By preventing the injection of holes, the turn-off loss is reduced. Therefore, power consumption of the IGBT 200 can be reduced.

By setting the second threshold voltage Vth2 to be higher than the first threshold voltage Vth1, the manufacture of the IGBT 200 becomes easy. Formation of a pattern on the rear surface of the semiconductor layer 10 is performed after the pattern on the front surface of the semiconductor layer 10 is formed. Therefore, an unevenness on the front surface of the semiconductor layer 10 is reflected on the rear surface of the semiconductor layer 10. Accordingly, it is difficult to form a pattern having small processing dimension or to form a thin film with good controllability on the rear surface of the semiconductor layer 10.

In the IGBT 200, for example, since the second threshold voltage Vth2 is high, the processing dimension of the pattern formed on the rear surface of the semiconductor layer 10 can be increased. For example, the film thickness of the second gate insulating film 22 of the control transistor 102 can be made thick.

By setting the second threshold voltage Vth2 to be higher than the first threshold voltage Vth1, the malfunction of the control transistor 102 can be prevented.

The absolute value of the second threshold voltage Vth2 is preferably greater than 1 times and 5 times or less the absolute value of the first threshold voltage Vth1, and more preferably 1.5 times or more and 3 times or less the absolute value of the first threshold voltage Vth1. When the absolute value of the second threshold voltage Vth2 exceeds the lower limit value described above, the malfunction of the control transistor 102 is further prevented. When the absolute value of the second threshold voltage Vth2 is below the upper limit value described above, the manufacture of the IGBT 200 becomes easier.

The absolute value of the second turn-on voltage Von2 is preferably greater than 1 times and 5 times or less the absolute value of the first turn-on voltage Von1, and more preferably 1.5 times or more and 3 times or less the absolute value of the first turn-on voltage Von1. When the absolute value of the second turn-on voltage Von2 exceeds the lower limit value described above, the malfunction of the control transistor 102 is further prevented. When the absolute value of the second turn-on voltage Von2 is below the upper limit value described above, the manufacture of the IGBT 200 becomes easier.

According to the semiconductor device and the semiconductor circuit described above, the turn-off loss of the IGBT can be reduced. Accordingly, the power consumption of the IGBT can be reduced.

Third Embodiment

Figure 8:
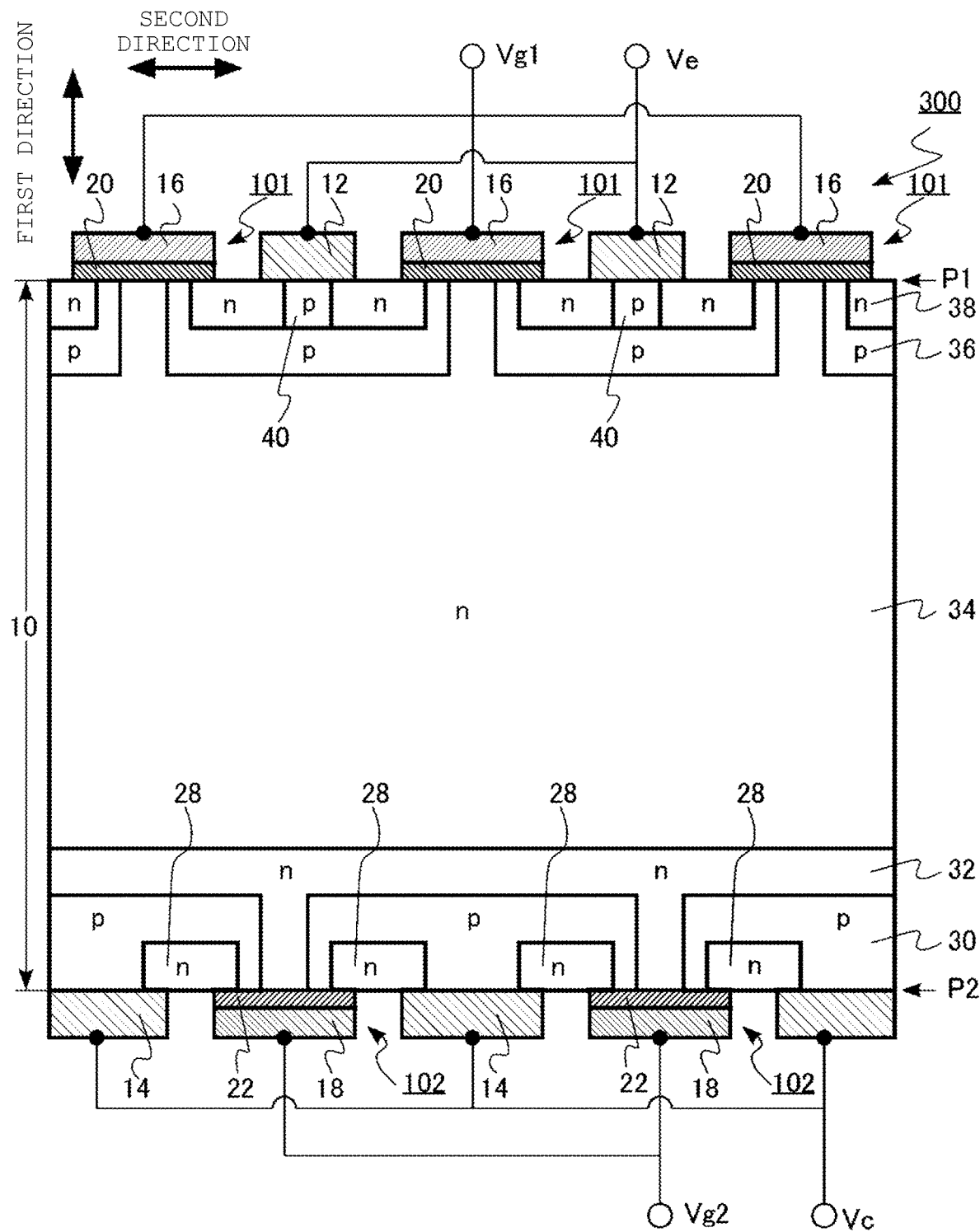
FIG. 8 is a schematic cross-sectional view of a semiconductor device according to a third embodiment.

In a semiconductor device and a semiconductor circuit according to a third embodiment, the first transistor is the planar gate type transistor. FIG. 8 is a schematic cross-sectional view of such a semiconductor device. Hereinafter, a case where the first conductivity type is the n-type and the second conductivity type is the p-type will be described as an example.

For example, the semiconductor device is an IGBT 300. The IGBT 300 includes the semiconductor layer 10, the emitter electrode 12, the collector electrode 14, the main gate electrode 16, the control gate electrode 18, the first gate insulating film 20, and the second gate insulating film 22.

The IGBT 300 includes the main transistor 101 including the main gate electrode 16 as a gate electrode and the control transistor 102 including the control gate electrode 18 as a gate electrode.

The main transistor 101 is provided on the front surface of the semiconductor layer 10. The control transistor 102 is provided on the rear surface of the semiconductor layer 10.

In the semiconductor layer 10, the n-type rear surface drain area 28, the p-type collector area 30, the n-type buffer area 32, the n-type drift area 34, the p-type base area 36, the n-type emitter area 38, and the p-type contact area 40 are provided.

The main transistor 101 is a planar gate type transistor. The main transistor 101 is a normally-off re-channel transistor. The main transistor 101 has the first threshold voltage Vth1. The first threshold voltage Vth1 is a positive voltage.

The control transistor 102 is also the planar gate type transistor. The control transistor 102 is the normally-off n-channel transistor. The control transistor 102 has the second threshold voltage Vth2.

The absolute value of the second threshold voltage Vth2 of the control transistor 102 is different from the absolute value of the first threshold voltage Vth1 of the main transistor 101. The absolute value of the second threshold voltage Vth2 is, for example, 0.2 times or more and 5 times or less the absolute value of the first threshold voltage Vth1.

The first turn-on voltage Von1 is applied to the main gate electrode 16 of the IGBT 300. The second turn-on voltage Von2 different from the first turn-on voltage Von1 is applied to the control gate electrode 18. The absolute value of the second turn-on voltage Von2 is different from the absolute value of the first turn-on voltage Von1. For example, the absolute value of the second turn-on voltage Von2 is 0.2 times or more and 5 times or less the absolute value of the first turn-on voltage Von1.

According to the semiconductor device and the semiconductor circuit described above, the turn-off loss of the IGBT can be reduced. Accordingly, the power consumption of the IGBT can be reduced.

Fourth Embodiment

Figure 9:
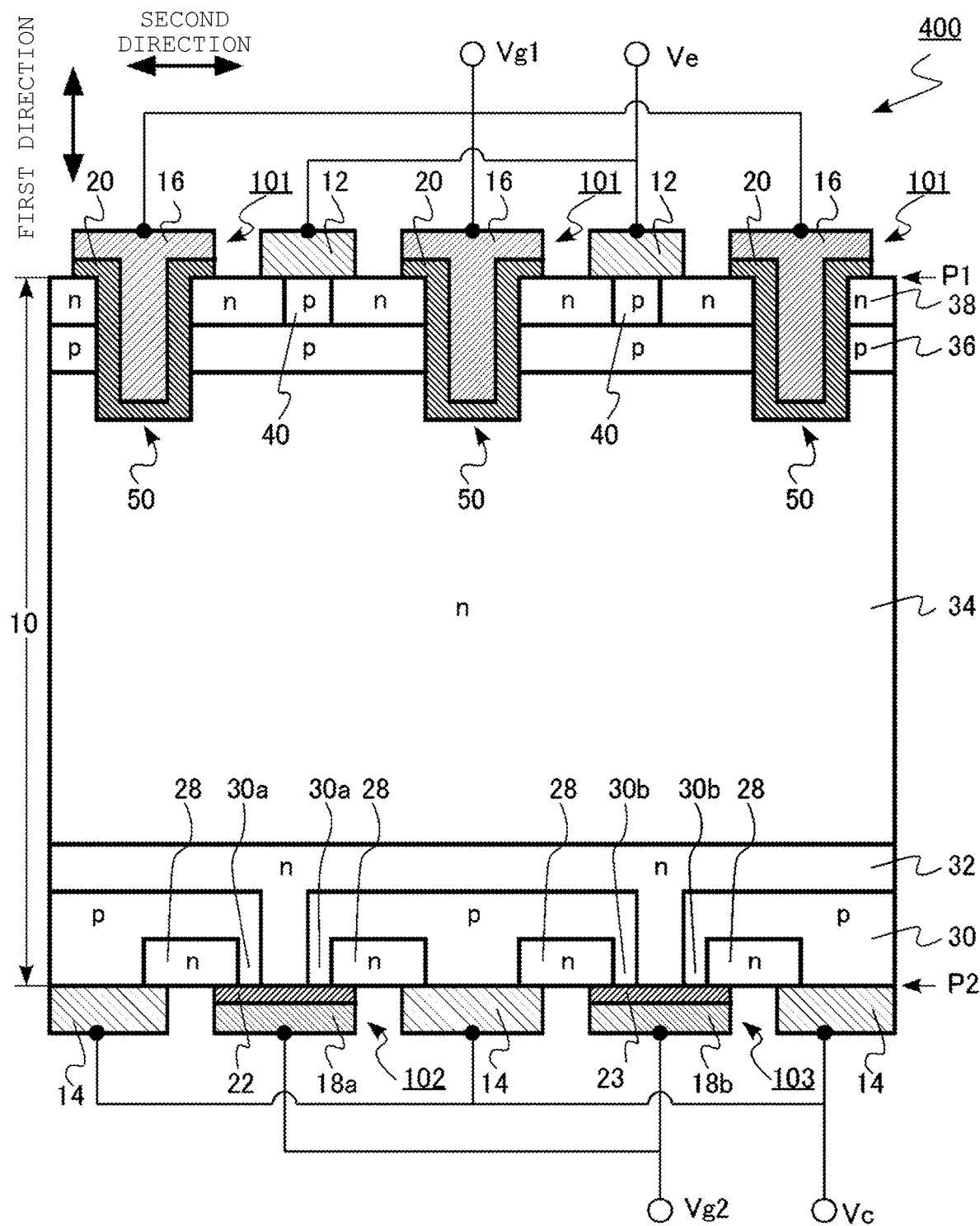
FIG. 9 is a schematic cross-sectional view of a semiconductor device according to a fourth embodiment.

In a semiconductor device and a semiconductor circuit according to a fourth embodiment, two different control gate electrodes are provided on the rear surface of the semiconductor device. Furthermore, the conductive impurity ("dopant") concentration of a first portion of the semiconductor region facing one of the control gate electrodes is different from the conductive impurity ("dopant") concentration of a second portion of the semiconductor region facing the other control gate electrode. FIG. 9 is a schematic cross-sectional view of such a semiconductor device. Hereinafter, a case where the first conductivity type is the n-type and the second conductivity type is the p-type will be described as an example.

For example, the semiconductor device is an IGBT 400. The IGBT 400 includes the semiconductor layer 10, the emitter electrode 12, the collector electrode 14, the main gate electrode 16, a first control gate electrode 18a, a second control gate electrode 18b, the first gate insulating film 20, the second gate insulating film 22, and a third gate insulating film 23. The trench 50 is formed in the semiconductor layer 10.

The IGBT 400 includes the main transistor 101 including the main gate electrode 16 as a gate electrode, a first control transistor 102 including the first control gate electrode 18a as a gate electrode, and a second control transistor 103 including the second control gate electrode 18b as a gate electrode.

The main transistor 101 is provided on the front surface of the semiconductor layer 10. The first control transistor 102 is provided on the rear surface of the semiconductor layer 10. The second control transistor 103 is provided on the rear surface of the semiconductor layer 10.

In the semiconductor layer 10, the n-type rear surface drain area 28, the p-type collector area 30, the n-type buffer area 32, the n-type drift area 34, the p-type base area 36, the n-type emitter area 38, and the p-type contact area 40 are provided.

The semiconductor layer 10 has the front or first surface P1 and the rear or second surface P2 facing the first surface P1. The semiconductor layer 10 is, for example, monocrystalline silicon. A film thickness of the semiconductor layer 10 is, for example, 40 μm or more and 700 μm or less.

The normal line direction of the first surface P1 and the normal line direction of the second surface P2 are defined as the first direction. One direction parallel to the first surface P1 and the second surface P2 is defined as the second direction. The direction parallel to the first surface P1 and the second surface P2 and perpendicular to the second direction is defined as the third direction.

The emitter electrode 12 is provided on the first surface P1 of the semiconductor layer 10. At least a part of the emitter electrode 12 is in contact with the first surface P1 of the semiconductor layer 10. The emitter electrode 12 is, for example, a metal. The emitter voltage Ve is applied to the emitter electrode 12. The emitter voltage is, for example, 0 V.

The collector electrode 14 is provided on the second surface P2 of the semiconductor layer 10. At least a part of the collector electrode 14 is in contact with the second surface P2 of the semiconductor layer 10. The collector electrode 14 is, for example, a metal.

The collector voltage Vc is applied to the collector electrode 14. The collector voltage is, for example, 200 V or more and 6500 V or less.

The main gate electrode 16 is provided along the first surface P1 of the semiconductor layer 10. At least a part of the main gate electrode 16 is provided in the trench 50 formed on the side of the first surface P1 of the semiconductor layer 10. The main gate electrode 16 extends in the third direction along the first surface P1 of the semiconductor layer 10.

The main gate electrode 16 is, for example, polycrystalline silicon containing n-type impurities or p-type impurities. The first gate voltage Vg1 is applied to the main gate electrode 16. The first gate voltage Vg1 is a voltage with the emitter voltage Ve as a reference.

The first gate insulating film 20 is provided between the main gate electrode 16 and the semiconductor layer 10. At least a part of the first gate insulating film 20 is provided in the trench 50. The first gate insulating film 20 is, for example, a silicon oxide film.

The first control gate electrode 18a is along the second surface P2 of the semiconductor layer 10. The first control gate electrode 18a extends in the third direction along the second surface P2 of the semiconductor layer 10.

The first control gate electrode 18a is, for example, polycrystalline silicon containing n-type impurities or p-type impurities. The second gate voltage Vg2 is applied to the first control gate electrode 18a. The second gate voltage Vg2 is a voltage with the collector voltage Vc as a reference.

The second gate insulating film 22 is provided between the first control gate electrode 18a and the semiconductor layer 10. The second gate insulating film 22 is, for example, a silicon oxide film.

The second control gate electrode 18b is provided along the second surface P2 of the semiconductor layer 10. The second control gate electrode 18b extends in the third direction along the second surface P2 of the semiconductor layer 10.

The second control gate electrode 18b is, for example, polycrystalline silicon containing n-type impurities or p-type impurities. The second gate voltage Vg2 is applied to the second control gate electrode 18b. The second gate voltage Vg2 is a voltage with the collector voltage Vc as a reference.

A third gate insulating film 23 is provided between the second control gate electrode 18b and the semiconductor layer 10. The material of the third gate insulating film 23 is the same as the material of the second gate insulating film 22. The third gate insulating film 23 is, for example, a silicon oxide film.

The p-type collector area 30 is provided between the drift area 34 and the second surface P2. A part of the collector area 30 is in contact with the second surface P2.

The collector area 30 includes a first portion 30a that faces the first control gate electrode 18a with the second gate insulating film 22 interposed therebetween. The collector area 30 further includes a second portion 30b that faces the second control gate electrode 18b with the third gate insulating film 23 interposed therebetween. The collector area 30 extends in the third direction along the second surface P2.

A channel of the first control transistor 102 controlled by the first control gate electrode 18a is formed in the first portion 30a of the collector area 30 facing the first control gate electrode 18a. A channel of the second control transistor 103 controlled by the second control gate electrode 18b is formed in the second portion 30b of the collector area 30 facing the second control gate electrode 18b.

The p-type impurity concentration of the second portion 30b of the collector area 30 facing the second control gate electrode 18b is higher than the p-type impurity concentration of the first portion 30a of the collector area 30 facing the first control gate electrode 18a.

The collector area 30 is electrically connected to the collector electrode 14. A part of the collector area 30 is in contact with the collector electrode 14.

The n-type rear surface drain area 28 is provided between the collector area 30 and the second surface P2. A part of the rear surface drain area 28 faces the first control gate electrode 18a with the second gate insulating film 22 interposed therebetween. Another part of the rear surface drain area 28 faces the second control gate electrode 18b with the third gate insulating film 23 interposed therebetween.

A part of the n-type rear surface drain area 28 is in contact with the collector electrode 14. The rear surface drain area 28 extends in the third direction along the second surface P2. The rear surface drain area 28 functions as a drain of the first control transistor 102. The rear surface drain area 28 functions as a drain of the second control transistor 103.

The n-type impurity concentration of the rear surface drain area 28 is higher than the n-type impurity concentration of the drift area 34.

The n-type drift area 34 is provided between the collector area 30 and the first surface P1. The drift area 34 is provided between the collector area 30 and the base area 36.

The drift area 34 serves as an on-current path when the IGBT 400 is in an on state. The drift area 34 has a function of depleting when the IGBT 400 is in an off state and maintaining a breakdown voltage of the IGBT 400.

The n-type buffer area 32 is provided between the drift area 34 and the collector area 30. A part of the buffer area 32 is in contact with the second surface P2. A part of the buffer area 32 faces the first control gate electrode 18a with the second gate insulating film 22 interposed therebetween. Another portion of the buffer area faces the second control gate electrode 18b with the third gate insulating film 23 interposed therebetween.

The n-type impurity concentration of the buffer area 32 is higher than the n-type impurity concentration of the drift area 34.

The buffer area 32 has a lower resistance than the drift area 34. By providing the buffer area 32, when the first control transistor 102 and the second control transistor 103 are turned on, discharge of electrons from the drift area 34 to the collector electrode 14 via the first control transistor 102 and the second control transistor 103 is promoted. The buffer area 32 also has a function of preventing elongation of the depletion layer when the IGBT 400 is in the off state. A configuration not including the buffer area 32 may also be adopted.

The p-type base area 36 is provided between the drift area 34 and the first surface P1. A part of the base area faces the main gate electrode 16 with the first gate insulating film 20 interposed therebetween. In the base area 36 facing the main gate electrode 16, a channel of the main transistor 101 controlled by the main gate electrode 16 is formed.

The n-type emitter area 38 is provided between the base area 36 and the first surface P1. A part of the emitter area 38 faces the main gate electrode 16 with the first gate insulating film 20 interposed therebetween. The emitter area 38 extends in the third direction along the first surface P1.

The emitter area 38 is electrically connected to the emitter electrode 12. A part of the emitter area 38 is in contact with the emitter electrode 12.

The n-type impurity concentration of the emitter area 38 is higher than the n-type impurity concentration of the drift area 34. The emitter area 38 serves as an electron supply source when the IGBT 400 is in the on state.

The p-type contact area 40 is provided between the base area 36 and the first surface P1. The contact area 40 extends in the third direction along the first surface P1.

The contact area 40 is electrically connected to the emitter electrode 12. The contact area 40 is in contact with the emitter electrode 12.

The p-type impurity concentration of the contact area 40 is higher than the p-type impurity concentration of the base area 36.

The main transistor 101 is a trench gate type transistor including a main gate electrode in the trench. The main transistor 101 is a normally-off n-channel type transistor. The main transistor 101 has the first threshold voltage Vth1. The first threshold voltage Vth1 is a positive voltage.

The first control transistor 102 is a planar gate type transistor. The control transistor 102 is a normally-off n-channel transistor. The control transistor 102 has the second threshold voltage Vth2.

The positive and negative signs of the second threshold voltage Vth2 of the control transistor 102 and the first threshold voltage Vth1 of the main transistor 101 are the same. The absolute value of the second threshold voltage Vth2 of the control transistor 102 is different from, for example, the absolute value of the first threshold voltage Vth1 of the main transistor 101.

For example, the absolute value of the second threshold voltage Vth2 of the control transistor 102 is smaller than the absolute value of the first threshold voltage Vth1 of the main transistor 101. The absolute value of the second threshold voltage Vth2 is, for example, 0.2 times or more and less than 1 times the absolute value of the first threshold voltage Vth1.

In the IGBT 400, both the first threshold voltage Vth1 and the second threshold voltage Vth2 have positive signs. That is, both the first threshold voltage Vth1 and the second threshold voltage Vth2 are positive voltages. Accordingly, the second threshold voltage Vth2 is lower than the first threshold voltage Vth1.

The second control transistor 103 is a planar gate type transistor. The second control transistor 103 is a normally-off n-channel transistor. The second control transistor 103 has a third threshold voltage Vth3.

The positive and negative signs of the third threshold voltage Vth3 of the second control transistor 103 and the second threshold voltage Vth2 of the first control transistor 102 are the same. The absolute value of the third threshold voltage Vth3 of the second control transistor 103 is different from the absolute value of the second threshold voltage Vth2 of the first control transistor 102.

For example, the absolute value of the third threshold voltage Vth3 of the second control transistor 103 is larger than the absolute value of the second threshold voltage Vth2 of the first control transistor 102. The absolute value of the third threshold voltage Vth3 is, for example, 1.5 times or more and 3 times or less the absolute value of the second threshold voltage Vth2.

In the IGBT 400, both the third threshold voltage Vth3 and the second threshold voltage Vth2 have positive signs. That is, both the third threshold voltage Vth3 and the second threshold voltage Vth2 are positive voltages. Accordingly, the third threshold voltage Vth3 is higher than the second threshold voltage Vth2.

In the IGBT 400, the absolute value of the third threshold voltage Vth3 is larger than, for example, the absolute value of the first threshold voltage Vth1. Both the third threshold voltage Vth3 and the first threshold voltage Vth1 have positive signs. That is, both the third threshold voltage Vth3 and the first threshold voltage Vth1 are positive voltages. Accordingly, the third threshold voltage Vth3 is higher than the first threshold voltage Vth1.

The p-type impurity concentration of the second portion 30b of the collector area 30 facing the second control gate electrode 18b is higher than the p-type impurity concentration of the first portion 30a of the collector area 30 facing the first control gate electrode 18a. Accordingly, the third threshold voltage Vth3 is higher than the second threshold voltage Vth2.

For example, the second threshold voltage Vth2 can be made lower than the first threshold voltage Vth1 by making the p-type impurity concentration of the first portion 30a of the collector area 30 facing the first control gate electrode 18a lower than the p-type impurity concentration of the base area 36 facing the main gate electrode 16.

Figure 10:
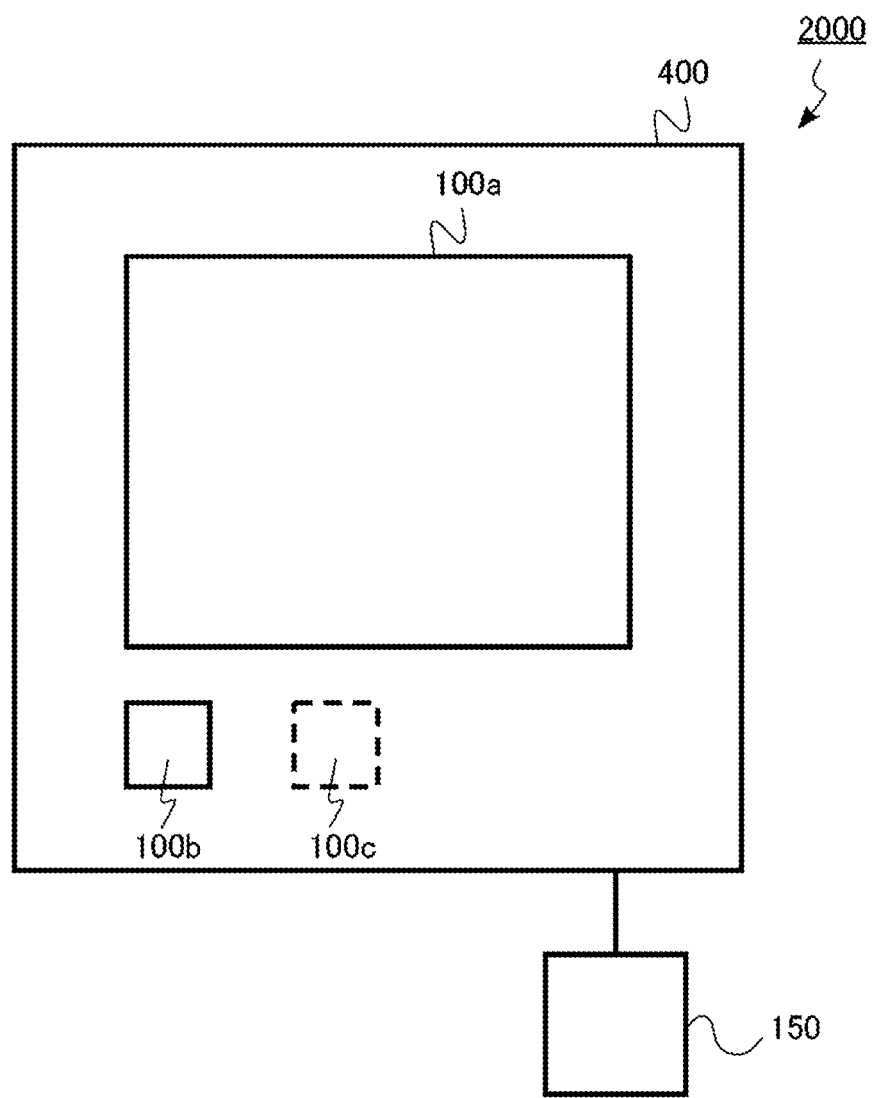
FIG. 10 is a schematic diagram of a semiconductor circuit according to a fourth embodiment.

FIG. 10 is a schematic diagram of a semiconductor circuit 2000 that includes the IGBT 400 and the control circuit 150. The semiconductor circuit 2000 is, for example, a semiconductor module in which the IGBT 400 and the control circuit 150 are mounted.

The IGBT 400 includes the transistor area 100a, the front surface gate electrode pad 100b, and the rear surface gate electrode pad 100c. The rear surface gate electrode pad 100c is located on the opposite surface of the semiconductor chip to the front surface gate electrode pad 100b.

The surface gate electrode pad 100b is electrically connected to the main gate electrode 16. The rear surface gate electrode pad 100c is electrically connected to the first control gate electrode 18a and the second control gate electrode 18b.

The first gate voltage Vg1 is applied to the surface gate electrode pad 100b. The second gate voltage Vg2 is applied to the rear surface gate electrode pad 100c.

The control circuit 150 controls the IGBT 400. The control circuit 150 is, for example, a gate driver circuit. The gate driver circuit controls the voltage applied to the front surface gate electrode pad 100b and the rear surface gate electrode pad 100c. The gate driver circuit controls the first gate voltage Vg1 applied to the main gate electrode 16 and the second gate voltage Vg2 applied to the first control gate electrode 18a and the second control gate electrode 18b.

Figure 11:
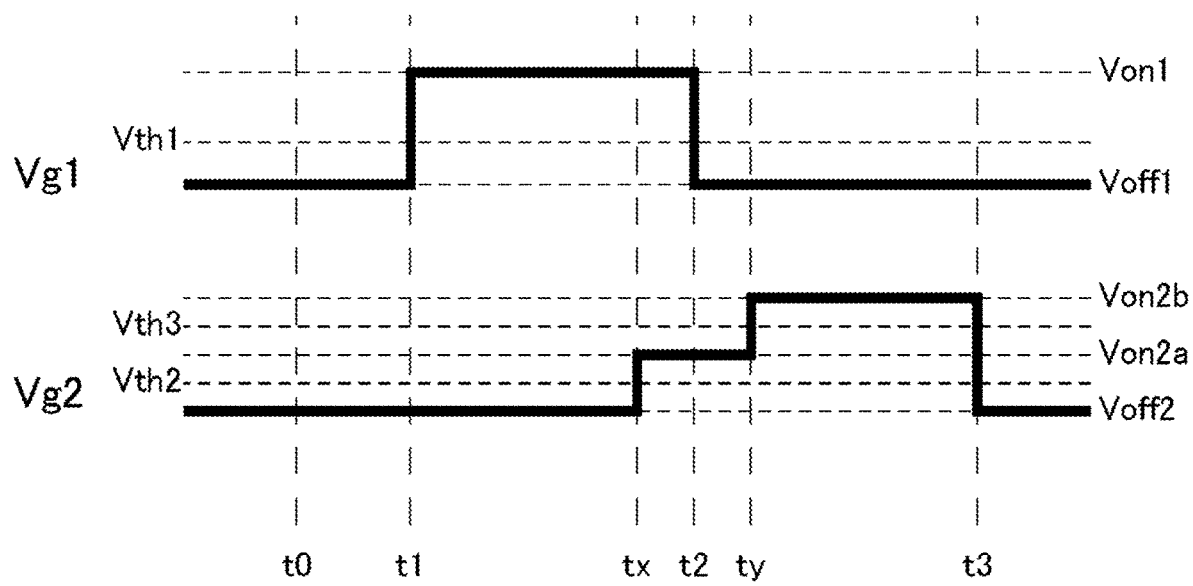
FIG. 11 is a timing chart of a semiconductor device according to a fourth embodiment.

Next, an operation of the IGBT 400 will be described. FIG. 11 is a timing chart of the first gate voltage Vg1 and the second gate voltage Vg2.

While the IGBT 400 is turned off, the emitter voltage Ve is applied to the emitter electrode 12. For example, at time t0, the emitter voltage Ve is applied to the emitter electrode 12. The emitter voltage Ve is, for example, 0 V. The collector voltage Vc is applied to the collector electrode 14. The collector voltage Vc is, for example, 200 V or more and 6500 V or less. The collector-emitter voltage Vce applied between the collector electrode 14 and the emitter electrode 12 is, for example, 200 V or more and 6500 V or less.

The first gate voltage Vg1 is a voltage with the emitter voltage Ve as a reference. The second gate voltage Vg2 is a voltage with the collector voltage Vc as a reference.

When the IGBT 400 is in an off state, the first turn-off voltage Voff1 is applied as the first gate voltage Vg1. The first turn-off voltage Voff1 is a voltage equal to or lower than the first threshold voltage Vth1 at which the main transistor 101 is not turned on. The first turn-off voltage Voff1 is, for example, 0 V or a negative voltage.

While the IGBT 400 is turned off, the second turn-off voltage Voff2 is applied as the second gate voltage Vg2. The second turn-off voltage Voff2 is a voltage equal to or lower than the second threshold voltage Vth2 and the third threshold voltage Vth3 at which the first control transistor 102 and the second control transistor 103 are not turned on. The second turn-off voltage Voff2 is, for example, 0 V or a negative voltage.

The IGBT 400 is turned on at the time t1. When the IGBT 400 is turned on to be brought into the on state, the first turn-on voltage Von1 is applied to the main gate electrode 16 as the first gate voltage Vg1. The first turn-on voltage Von1 is a positive voltage exceeding the first threshold voltage Vth1 of the main transistor 101 including the main gate electrode 16 as the gate electrode. The first turn-on voltage Von1 is, for example, 15 V.

By applying the first turn-on voltage Von1 to the main gate electrode 16, an n-type inversion layer is formed in the vicinity of the interface of the p-type base area 36 with the first gate insulating film 20. By forming the n-type inversion layer, electrons are injected from the n-type emitter area 38 into the n-type drift area 34 through the n-type inversion layer. The pn junction formed by the n-type buffer area 32 and the p-type collector area 30 is forward biased by the electrons injected into the n-type drift area 34. The electrons reach the collector electrode 14 and cause injection of holes from the p-type collector area 30. The IGBT 400 is turned on.

When the IGBT 400 is in the on state, the second gate voltage Vg2 is the second turn-off voltage Voff2.

The IGBT 400 is turned off at the time t2. When the IGBT 400 is turned off to be brought into the off state, the first turn-off voltage Voff1 is applied to the main gate electrode 16 as the first gate voltage Vg1.

By applying the first turn-off voltage Voff1 to the main gate electrode 16, the n-type inversion layer formed in the vicinity of the interface of the p-type base area 36 with the first gate insulating film 20 is removed. Therefore, the injection of electrons from the n-type emitter area 38 to the n-type drift area 34 is stopped. The IGBT 400 shifts to the off state.

At the time tx before the first turn-off voltage Voff1 is applied to the main gate electrode 16, a first step voltage Von2a of the second turn-on voltage V is applied to the first control gate electrode 18a as the second gate voltage Vg2. The first step voltage Von2a of the second turn-on voltage is a positive voltage exceeding the second threshold voltage Vth2 of the first control transistor 102 including the first control gate electrode 18a as the gate electrode. The first step voltage Von2a of the second turn-on voltage is a positive voltage that does not exceed the third threshold voltage Vth3 of the second control transistor 103 including the second control gate electrode 18b as the gate electrode.

The first step voltage Von2a of the second turn-on voltage is applied to the first control gate electrode 18a to bring the first control transistor 102 into the on state. An n-type inversion layer is formed in the vicinity of the interface of the p-type collector area 30 with the second gate insulating film 22, and the first control transistor 102 is turned on.

By forming the n-type inversion layer in the vicinity of the interface of the p-type collector area 30 with the second gate insulating film 22, a path in which electrons are discharged from the n-type buffer area 32 through the n-type inversion layer and the n-type rear surface drain area 28 to the collector electrode 14 is formed. That is, a state in which the n-type buffer area 32 and the collector electrode 14 are short-circuited, that is, a so-called anode short circuit occurs.

Due to the occurrence of the anode short circuit, electrons are prevented from reaching the collector electrode 14 from the n-type buffer area 32 through the p-type collector area 30, and the injection of holes from the p-type collector area 30 into the drift area 34 is prevented.

Furthermore, at time ty after the first turn-off voltage Voff1 is applied to the main gate electrode 16, a second step voltage Von2b of the second turn-on voltage is applied to the second control gate electrode 18b as the second gate voltage Vg2. The second step voltage Von2b of the second turn-on voltage is a positive voltage exceeding the second threshold voltage Vth3 of the second control transistor 103 including the second control gate electrode 18b as the gate electrode.

The second step voltage Von2b of the second turn-on voltage is applied to the second control gate electrode 18b to bring the second control transistor 103 into the on state. An n-type inversion layer is formed in the vicinity of the interface of the p-type collector area 30 with the third gate insulating film 23, and the second control transistor 103 is turned on.

By forming the n-type inversion layer in the vicinity of the interface of the p-type collector area 30 with the third gate insulating film 23, a path in which electrons are discharged from the n-type buffer area 32 through the n-type inversion layer and the n-type rear surface drain area 28 to the collector electrode 14 is formed.

Electrons are further prevented from reaching the collector electrode 14 from the n-type buffer area 32 through the p-type collector area 30, and the injection of holes from the p-type collector area 30 into the drift area 34 is further prevented.

By preventing the injection of holes during the turn-off operation of the IGBT 400, a tail current during the turn-off operation can be reduced. Accordingly, the turn-off time of the IGBT 400 is shortened. Thus, a turn-off loss of the IGBT 400 is reduced.

After that, at the time t3, the second turn-off voltage Voff2 is applied to the first control gate electrode 18a and the second control gate electrode 18b. With this configuration, the first control transistor 102 and the second control transistor 103 are brought into the off state.

In the IGBT 400, by providing the first control transistor 102 and the second control transistor 103 on the rear surface of the semiconductor layer 10, the injection of holes into the n-type drift area 34 is prevented during the turn-off operation. By preventing the injection of holes, the turn-off loss is reduced. Therefore, the power consumption can be reduced.

Figure 12:
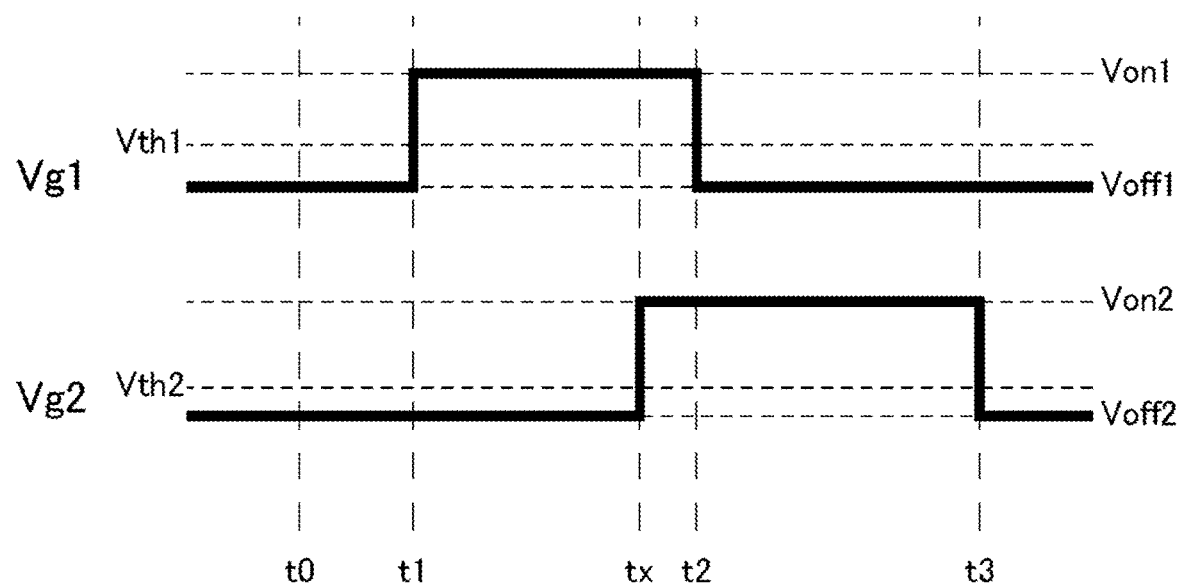
FIG. 12 is a timing chart of a semiconductor device of a comparative example.

FIG. 12 is a timing chart of a semiconductor device of a comparative example. FIG. 12 illustrates the operation timings of the first gate voltage Vg1 and the second gate voltage Vg2.

A semiconductor device of the comparative example is an IGBT. The IGBT of the comparative example does not include the second control transistor 103.

In the IGBT of the comparative example, the threshold voltages of the control transistors on the rear surface of the semiconductor layer 10 are all the same.

In the IGBT of the comparative example, as illustrated in FIG. 12, the second turn-on voltage Von2 is applied to the control gate electrode as the second gate voltage Vg2 at the time tx before the first turn-off voltage Voff1 is applied to the main gate electrode. At this point in time, all the control transistors on the rear surface of the semiconductor layer 10 are turned on.

In the IGBT of the comparative example, injection of holes into the n-type drift area is prevented during the turn-off operation. By preventing the injection of holes, the turn-off loss is reduced.

However, when the injection of holes into the n-type drift area of the hole is blocked, depletion of the n-type drift area is rapidly progressed from the rear surface side transiently. In such a case, a large surge voltage is generated by punching through the depletion layer extending from the front surface side and the depletion layer extending from the rear surface side. The large surge voltage may destroy the IGBT. Further, the large surge voltage causes electromagnetic interference (EMI) due to high-frequency voltage vibration.

Figure 13:
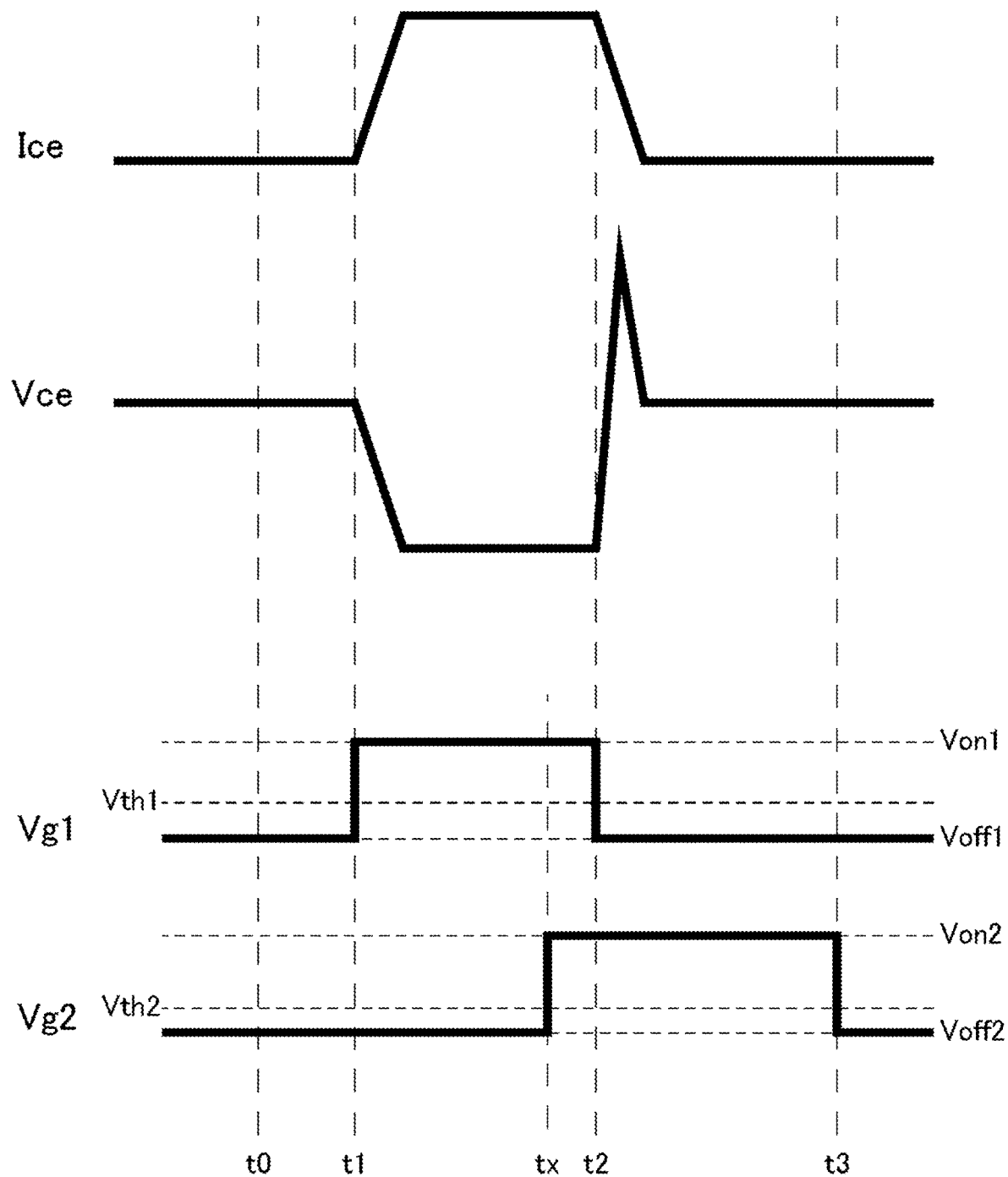
FIG. 13 is a timing chart of a semiconductor device of a comparative example.

FIG. 13 is a timing chart of the semiconductor device of the comparative example. FIG. 13 illustrates the collector-emitter voltage Vce and a collector-emitter current Ice in addition to the operation timings of the first gate voltage Vg1 and the second gate voltage Vg2.

As illustrated in FIG. 13, at the time tx, the second turn-on voltage Von2 is applied to the first control gate electrode 18a as the second gate voltage Vg2. At this point in time, all the control transistors on the rear surface of the semiconductor layer 10 are turned on, and thus the n-type drift area 34 is rapidly depleted from the second surface P2 side.

When the depletion layer extending from the front surface side and the depletion layer extending from the rear surface side are punched through, as illustrated in FIG. 13, the collector-emitter voltage Vce greatly jumps and a surge voltage is generated. Therefore, the IGBT may be destroyed or EMI occurs. Accordingly, reliability of the IGBT is reduced.

Figure 14:
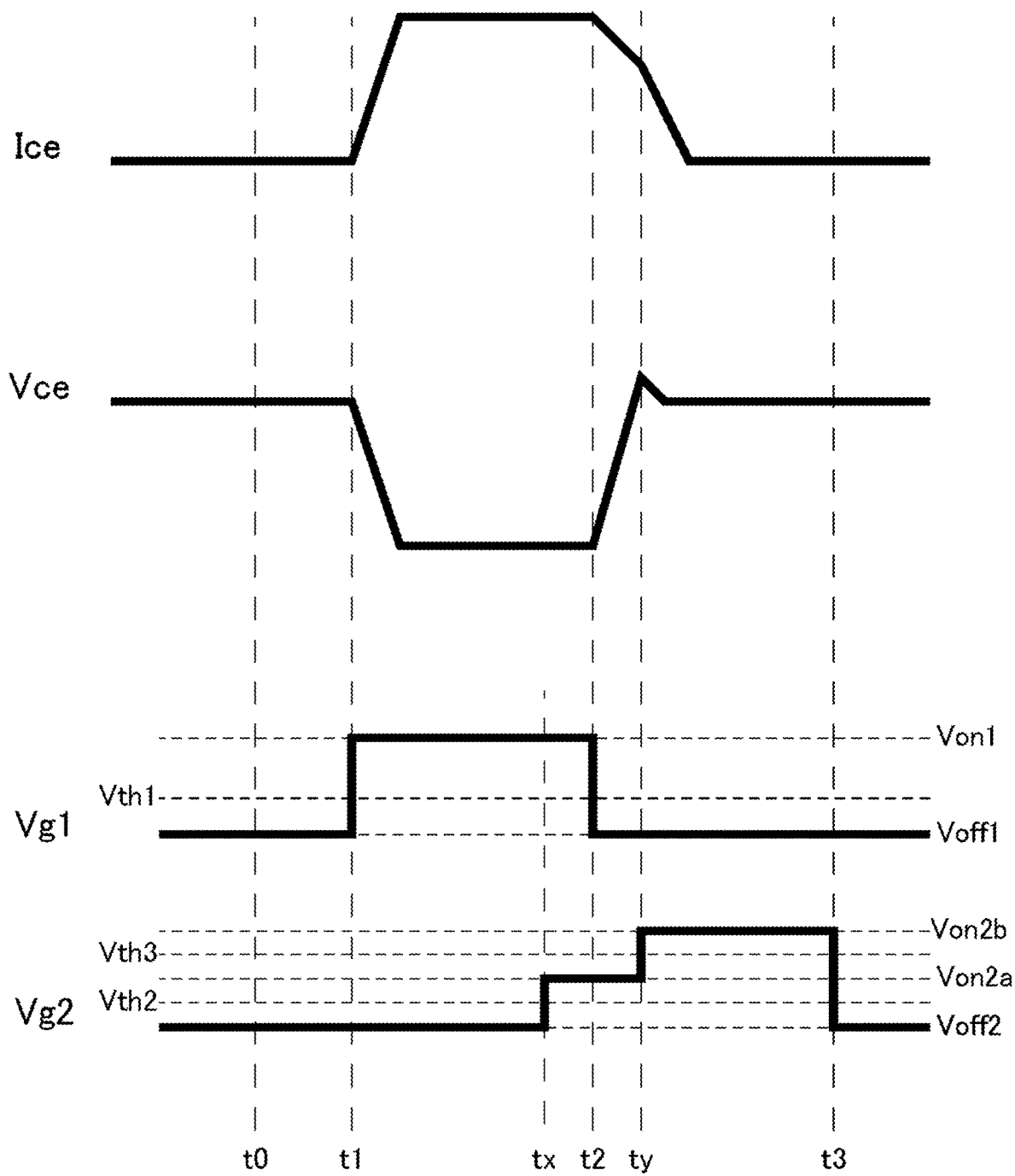
FIG. 14 is a timing chart of a semiconductor device according to a fourth embodiment.

FIG. 14 is a timing chart of the IGBT 400. FIG. 14 illustrates the collector-emitter voltage Vce and the collector-emitter current Ice in addition to the operation timings of the first gate voltage Vg1 and the second gate voltage Vg2.

In the IGBT 400, first, the first control transistor 102 is turned on, and then, after a while, the second control transistor 103 is brought into the on state. Therefore, blocking of the injection of holes occurs step by step. Accordingly, punch-through of the depletion layer is less likely to occur. Thus, generation of surge voltage is prevented and reliability is improved.

It is preferable to turn on the second control transistor 103 after the collector-emitter voltage Vce reaches a power supply voltage of the IGBT 400. After the second control transistor 103 is turned on, the depletion layer does not extend from the second surface P2 side, and punch-through of the depletion layer is less likely to occur.

The time tx when the second turn-on voltage Von2 is applied to the first control gate electrode 18a is not necessarily limited to before the time t2 when the first turn-off voltage Voff1 is applied to the main gate electrode 16. The time tx may be a time after the time t2 or at the same time as the time t2.

A case where the second threshold voltage Vth2 <the first threshold voltage Vth1 <the third threshold voltage Vth3 is described as an example, and the magnitude relationship between the first threshold voltage Vth1, the second threshold voltage Vth2, and the third threshold voltage Vth3 is not limited to the relationship of the inequality described above. For example, either the second threshold voltage Vth2 or the third threshold voltage Vth3 may be the same as the first threshold voltage Vth1.

According to the semiconductor device and the semiconductor circuit described above, the turn-off loss of the IGBT can be reduced. Accordingly, the power consumption of the IGBT can be reduced. The generation of surge voltage of the IGBT is prevented, and the reliability of the IGBT is improved.

Fifth Embodiment

Figure 15:
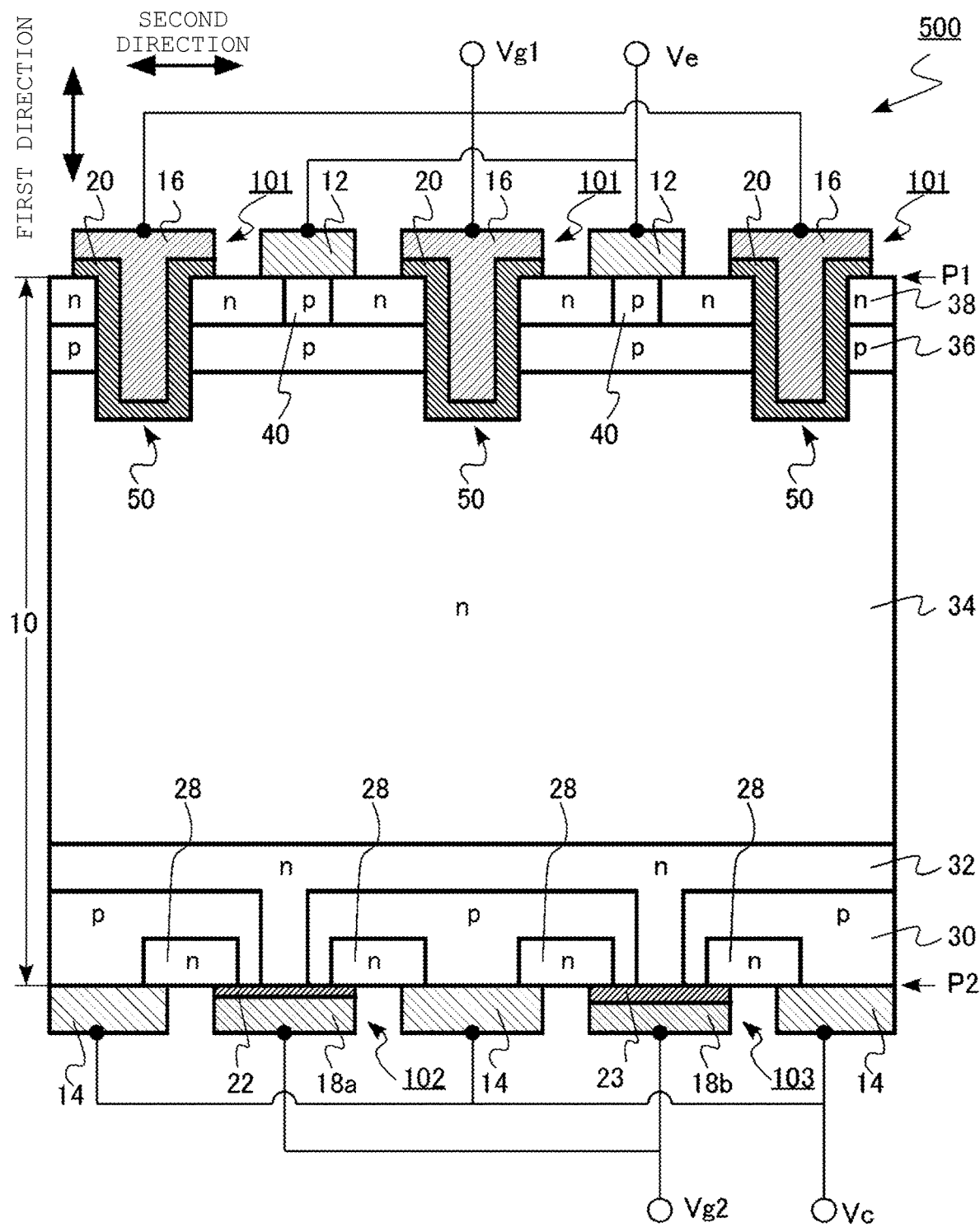
FIG. 15 is a schematic cross-sectional view of a semiconductor device according to a fifth embodiment.

In a semiconductor device and a semiconductor circuit according to a fifth embodiment, the film thickness of the third gate insulating film is thicker than the film thickness of the second gate insulating film. FIG. 15 is a schematic cross-sectional view of such a semiconductor device. Hereinafter, a case where the first conductivity type is the n-type and the second conductivity type is the p-type will be described as an example.

For example, the semiconductor device is an IGBT 500. The IGBT 500 includes the semiconductor layer 10, the emitter electrode 12, the collector electrode 14, the main gate electrode 16, the first control gate electrode 18a, the second control gate electrode 18b, the first gate insulating film 20, the second gate insulating film 22, and the third gate insulating film 23. The trench 50 is formed in the semiconductor layer 10.

The IGBT 500 includes the main transistor 101 including the main gate electrode 16 as a gate electrode, the first control transistor 102 including the first control gate electrode 18a as a gate electrode, and the second control transistor 103 including the second control gate electrode 18b as a gate electrode.

The main transistor 101 is provided on the front surface of the semiconductor layer 10. The first control transistor 102 is provided on the rear surface of the semiconductor layer 10. The second control transistor 103 is provided on the rear surface of the semiconductor layer 10.

The material of the second gate insulating film 22 and the material of the third gate insulating film 23 are the same. The second gate insulating film 22 and the third gate insulating film 23 are, for example, silicon oxide films.

The film thickness of the third gate insulating film 23 is thicker than the film thickness of the second gate insulating film 22. The film thickness of the third gate insulating film 23 is, for example, 1.5 times or more and 5 times or less the film thickness of the second gate insulating film 22.

Since the film thickness of the third gate insulating film 23 is thicker than the film thickness of the second gate insulating film 22, the third threshold voltage Vth3 of the second control transistor 103 becomes higher than the second threshold voltage Vth2 of the control transistor 102.

According to the semiconductor device and the semiconductor circuit described above, the turn-off loss of the IGBT can be reduced. Accordingly, the power consumption of the IGBT can be reduced. Further, the generation of surge voltage of the IGBT is prevented, and the reliability of the IGBT is improved.

Sixth Embodiment

Figure 16:
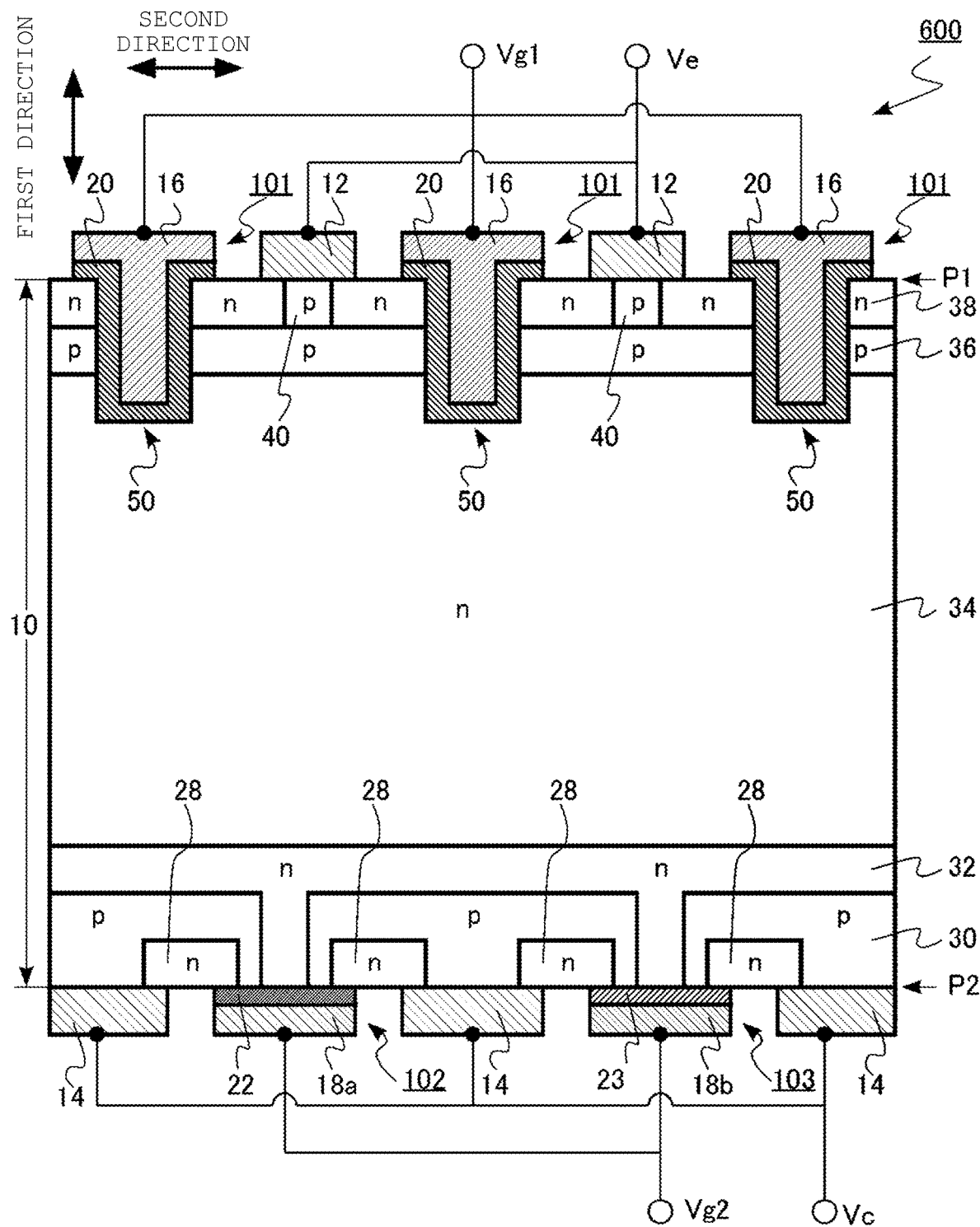
FIG. 16 is a schematic cross-sectional view of a semiconductor device according to a sixth embodiment.

In a semiconductor device and a semiconductor circuit according to a sixth embodiment, the material of the third gate insulating film is different from the material of the second gate insulating film. FIG. 16 is a schematic cross-sectional view of such a semiconductor device. Hereinafter, a case where the first conductivity type is the n-type and the second conductivity type is the p-type will be described as an example.

For example, the semiconductor device is an IGBT 600. The IGBT 600 includes the semiconductor layer 10, the emitter electrode 12, the collector electrode 14, the main gate electrode 16, the first control gate electrode 18a, the second control gate electrode 18b, the first gate insulating film 20, the second gate insulating film 22, and the third gate insulating film 23. The trench 50 is formed in the semiconductor layer 10.

The IGBT 600 includes the main transistor 101 including the main gate electrode 16 as a gate electrode, the first control transistor 102 including the first control gate electrode 18a as a gate electrode, and the second control transistor 103 including the second control gate electrode 18b as a gate electrode.

The main transistor 101 is provided on the surface of the semiconductor layer 10. The first control transistor 102 is provided on the rear surface of the semiconductor layer 10. The second control transistor 103 is also provided on the rear surface of the semiconductor layer 10.

The material of the third gate insulating film 23 is different from the material of the second gate insulating film 22. For example, a dielectric constant of the material of the third gate insulating film 23 is lower than the dielectric constant of the material of the second gate insulating film 22.

For example, the material of the third gate insulating film 23 is silicon oxide, and the material of the second gate insulating film 22 is a high dielectric material having a higher dielectric constant than that of silicon oxide. The high dielectric material is, for example, hafnium oxide, zirconium oxide, or aluminum oxide.

By using a high-dielectric material as the material of the second gate insulating film 22, the third threshold voltage Vth3 of the second control transistor 103 becomes higher than the second threshold voltage Vth2 of the first control transistor 102.

According to the semiconductor device and the semiconductor circuit described above, the turn-off loss of the IGBT can be reduced. Accordingly, the power consumption of the IGBT can be reduced. Further, the generation of surge voltage of the IGBT is prevented, and the reliability of the IGBT is improved.

Seventh Embodiment

Figure 17:
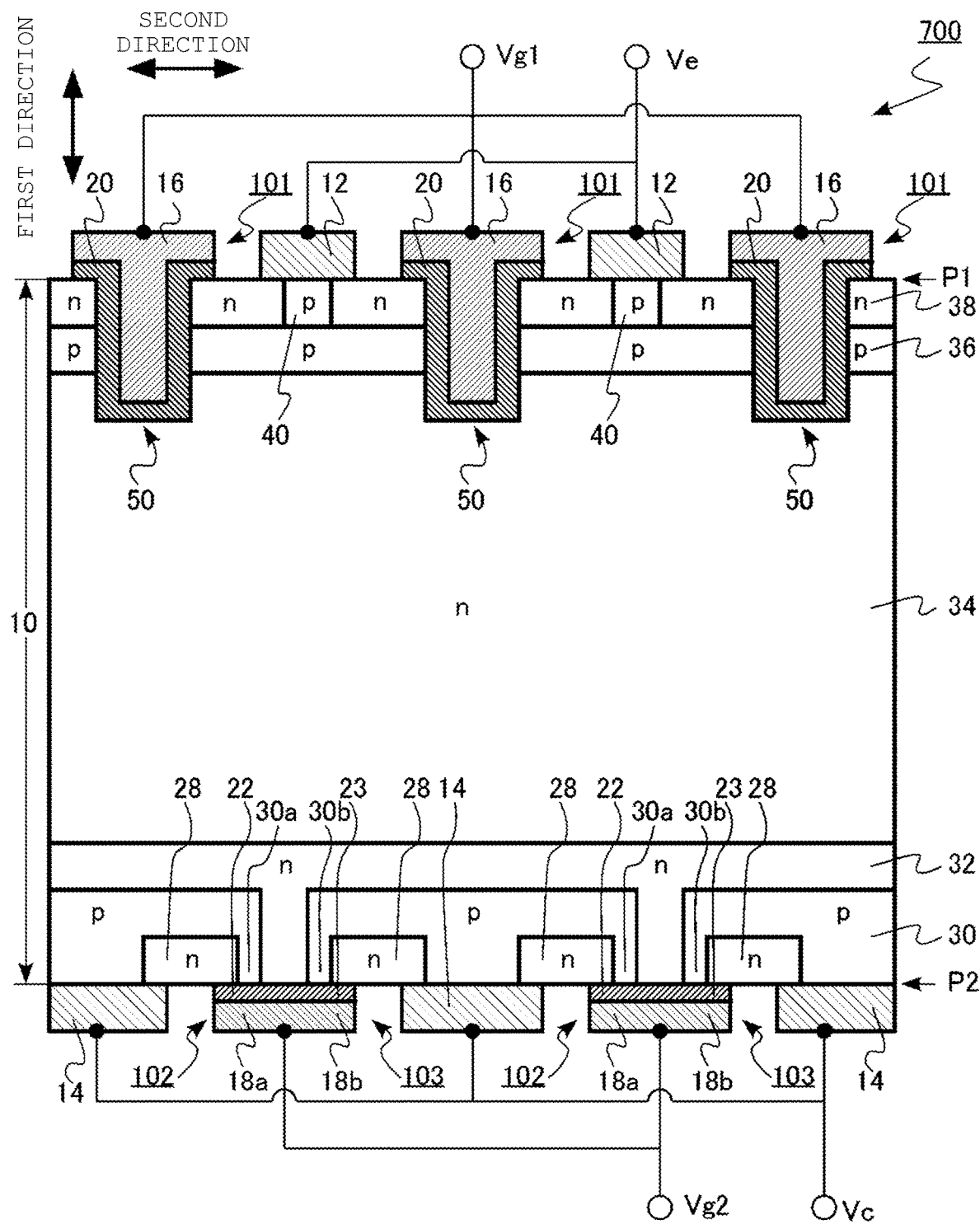
FIG. 17 is a schematic cross-sectional view of a semiconductor device according to a seventh embodiment.

In a semiconductor device and a semiconductor circuit according to a seventh embodiment, the second gate electrode and the third gate electrode are continuous. Hereinafter, some descriptions may be omitted for the contents that overlap with the fourth embodiment. FIG. 17 is a schematic cross-sectional view of such a semiconductor device. Hereinafter, a case where the first conductivity type is the n-type and the second conductivity type is the p-type will be described as an example.

For example, the semiconductor device is an IGBT 700. The IGBT 700 includes the semiconductor layer 10, the emitter electrode 12, the collector electrode 14, the main gate electrode 16, the first control gate electrode 18a, the second control gate electrode 18b, the first gate insulating film 20, the second gate insulating film 22, and the third gate insulating film 23. The trench 50 is formed in the semiconductor layer 10.

The IGBT 700 includes the main transistor 101 including the main gate electrode 16 as a gate electrode, the first control transistor 102 including the first control gate electrode 18a as a gate electrode, and the second control transistor 103 including the second control gate electrode 18b as a gate electrode.

The main transistor 101 is provided on the front surface of the semiconductor layer 10. The first control transistor 102 is provided on the rear surface of the semiconductor layer 10. The second control transistor 103 is provided on the rear surface of the semiconductor layer 10.

The first control gate electrode 18a and the second control gate electrode 18b are continuous. The second gate insulating film 22 and the third gate insulating film 23 are continuous.

The p-type impurity concentration of the second portion 30b of the collector area 30 facing the second control gate electrode 18b is higher than the p-type impurity concentration of the first portion 30a of the collector area 30 facing the first control gate electrode 18a. Accordingly, the third threshold voltage Vth3 of the second control transistor 103 is higher than the second threshold voltage Vth2 of the first control transistor 102.

According to the semiconductor device and the semiconductor circuit described above, the turn-off loss of the IGBT can be reduced. Accordingly, the power consumption of the IGBT can be reduced. Further, the generation of surge voltage of the IGBT is prevented, and the reliability of the IGBT is improved.

In the aforementioned embodiments, the case where the semiconductor layer is monocrystalline silicon is described as an example, and the semiconductor layer is not limited to monocrystalline silicon. For example, the semiconductor layer may be other single crystal semiconductors such as monocrystalline silicon carbide.

In the aforementioned embodiments, the case where the control transistor is a planar gate type transistor is described as an example, and the control transistor may be a trench gate type transistor.

In the aforementioned embodiments, the case where the first conductivity type is the n-type and the second conductivity type is the p-type is described as an example, and the first conductivity type may be the n-type and the second conductivity type may be the p-type.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a semiconductor layer having first and second surfaces;
   a first electrode and a first gate electrode arranged along the first surface; and
   a second electrode and a second gate electrode arranged along the second surface, wherein
   the semiconductor layer further includes:
     a first semiconductor region of a first conductivity type,
     a second semiconductor region of a second conductivity type provided between the first semiconductor region and the first surface and facing the first gate electrode,
     a third semiconductor region of the first conductivity type provided between the second semiconductor region and the first surface and contacting the first electrode,
     a fourth semiconductor region of the second conductivity type provided between the first semiconductor region and the second surface, facing the second gate electrode, and contacting the second electrode, and
     a fifth semiconductor region of the first conductivity type provided between the fourth semiconductor region and the second surface and contacting the second electrode, and
   a first transistor including the first gate electrode and a second transistor including the second gate electrode have first and second threshold voltages that are different and are both positive or negative.

2. The semiconductor device according to claim 1, wherein an absolute value of the second threshold voltage is 0.2 times or more and 5 times or less than an absolute value of the first threshold voltage.

3. The semiconductor device according to claim 1, wherein an absolute value of the second threshold voltage is smaller than an absolute value of the first threshold voltage.

4. The semiconductor device according to claim 1, wherein an absolute value of the second threshold voltage is larger than an absolute value of the first threshold voltage.

5. The semiconductor device according to claim 1, further comprising:
a first gate insulating layer between the first gate electrode and each of the first, second, and third semiconductor regions; and
a second gate insulating layer between the second gate electrode and each of the fourth and fifth semiconductor regions, wherein
a thickness of the first gate insulating layer is different from a thickness of the second gate insulating layer.

6. The semiconductor device according to claim 1, wherein
the first gate electrode extends along a first direction perpendicular to the first and second surfaces, and
the second and third semiconductor regions face the first gate electrode in a second direction parallel to the first and second surfaces.

7. The semiconductor device according to claim 6, wherein
the second gate electrode extends along the second surface, and
the fourth and fifth semiconductor regions face the second gate electrode in the first direction.

8. The semiconductor device according to claim 1, wherein
the first gate electrode extends along the first surface, and
the first, second, and third semiconductor layers face the first gate electrode in a first direction perpendicular to the first surface.

9. The semiconductor device according to claim 1, further comprising:
a third gate electrode arranged along the second surface and facing the fourth semiconductor region, wherein
a third transistor including the third gate electrode is formed and has a third threshold voltage that is different from the second threshold voltage, and
the first, second, and third threshold voltages are all positive or negative.

10. The semiconductor device according to claim 9, wherein an impurity concentration of a first portion of the fourth semiconductor region facing the second gate electrode is different from an impurity concentration of a second portion of the fourth semiconductor region facing the third gate electrode.

11. The semiconductor device according to claim 1, further comprising:
a first gate insulating layer between the first gate electrode and each of the first, second, and third semiconductor regions;
a second gate insulating layer between the second gate electrode and each of the fourth and fifth semiconductor regions;
a third gate electrode arranged along the second surface and facing the fourth semiconductor region; and
a third gate insulating layer between the third gate electrode and the fourth semiconductor region, wherein
a thickness of the second gate insulating layer is different from a thickness of the third gate insulating layer.

12. The semiconductor device according to claim 1, further comprising:
a first gate insulating layer between the first gate electrode and each of the first, second, and third semiconductor regions;
a second gate insulating layer between the second gate electrode and each of the fourth and fifth semiconductor regions;
a third gate electrode arranged along the second surface and facing the fourth semiconductor layer; and
a third gate insulating layer between the third gate electrode and the fourth semiconductor region, wherein
the second gate insulating layer is made of a different material from the third gate insulating layer.

13. The semiconductor device according to claim 1, further comprising:
a third electrode on the second surface; and
a sixth semiconductor region of the second conductivity type provided between the first semiconductor region and the second surface, facing the second gate electrode, and contacting the third electrode, wherein
an impurity concentration of the fourth semiconductor region is different from an impurity concentration of the sixth semiconductor region.

14. The semiconductor device according to claim 1, wherein the first conductivity type is n-type, and the second conductivity type is p-type.

15. An integrated circuit, comprising:
a semiconductor device including:
a semiconductor layer having first and second surfaces,
a first electrode and a first gate electrode arranged along the first surface, and
a second electrode and a second gate electrode arranged along the second surface,
wherein the semiconductor layer includes:
a first semiconductor region of a first conductivity type,
a second semiconductor region of a second conductivity type provided between the first semiconductor region and the first surface and facing the first gate electrode,
a third semiconductor region of the first conductivity type provided between the second semiconductor region and the first surface and contacting the first electrode,
a fourth semiconductor region of the second conductivity type provided between the first semiconductor region and the second surface, facing the second gate electrode, and contacting the second electrode,
a fifth semiconductor region of the first conductivity type provided between the fourth semiconductor region and the second surface and contacting the second electrode,
a first gate insulating layer between the first gate electrode and each of the first, second, and third semiconductor regions,
a second gate insulating layer between the second gate electrode and each of the fourth and fifth semiconductor regions, and
a thickness of the first gate insulating layer is different from a thickness of the second gate insulating layer; and
a control circuit configured to apply a first turn-on voltage to the first gate electrode and a second turn-on voltage having a different absolute value from the first turn-on voltage to the second gate electrode.

16. The integrated circuit according to claim 15, wherein the absolute value of the second turn-on voltage is smaller than the absolute value of the first turn-on voltage.

17. The integrated circuit according to claim 16, wherein the absolute value of the second turn-on voltage is larger than the absolute value of the first turn-on voltage.

18. The integrated circuit according to claim 15, wherein the control circuit is further configured to apply the first turn-on voltage before applying the second turn-on voltage.

19. The integrated circuit according to claim 15, wherein the second turn-on voltage is applied when the application of the first turn-of voltage is stopped.

* * * * *

UNITED STATES PATENT AND TRADEMARK OFFICE
CERTIFICATE OF CORRECTION

Page 1 of 1

PATENT NO. : 11,563,113 B2
APPLICATION NO. : 17/191288
DATED : January 24, 2023
INVENTOR(S) : Tomoko Matsudai et al.

It is certified that error appears in the above-identified patent and that said Letters Patent is hereby corrected as shown below:

In the Claims

In Column 25, Claim 19, Line 14, please delete "turn-of" and replace with "turn-on".

Signed and Sealed this
Twenty-second Day of August, 2023

Katherine Kelly Vidal
*Director of the United States Patent and Trademark Office*